(12) United States Patent
Scuderi et al.

(10) Patent No.: US 10,312,878 B2
(45) Date of Patent: Jun. 4, 2019

(54) METHOD OF SWITCHING ON AND OFF A POWER AMPLIFIER, RELATED POWER AMPLIFIER CIRCUIT, SYSTEM AND COMPUTER PROGRAM PRODUCT

(71) Applicant: STMicroelectronics S.r.l., Agrate Brianza (IT)

(72) Inventors: Angelo Scuderi, Catania (IT); Gesualdo Alessi, Catania (IT); Antonino Calcagno, Messina (IT); Giorgio Maiellaro, Gravina di Catania (IT); Salvatore Scaccianoce, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/609,492

(22) Filed: May 31, 2017

(65) Prior Publication Data

US 2018/0152164 A1 May 31, 2018

(30) Foreign Application Priority Data

Nov. 25, 2016 (IT) .......................... 102016000119588

(51) Int. Cl.
*H03G 3/34* (2006.01)
*H03G 3/30* (2006.01)
(Continued)

(52) U.S. Cl.
CPC ............. *H03G 3/34* (2013.01); *H03F 1/0216* (2013.01); *H03F 1/305* (2013.01); *H03F 3/189* (2013.01); *H03F 3/19* (2013.01); *H03F 3/21* (2013.01); *H03F 3/45475* (2013.01); *H03F 3/72* (2013.01); *H03G 1/0023* (2013.01); *H03G 3/3005* (2013.01); *H03G 3/3042* (2013.01);
(Continued)

(58) Field of Classification Search
USPC .................................. 330/51, 129, 9, 278
See application file for complete search history.

(56) References Cited

U.S. PATENT DOCUMENTS 4,123,755 A   10/1978  Fishbein et al.
4,592,073 A   5/1986   Watanabe
(Continued)

FOREIGN PATENT DOCUMENTS

WO       92/11702 A1     7/1992

*Primary Examiner* — Hieu P Nguyen
(74) *Attorney, Agent, or Firm* — Seed IP Law Group LLP

(57) ABSTRACT

Systems and methods for switching on and off a power amplifier including a signal input receiving an input signal and a signal output providing an output signal. The power amplifier includes a control input receiving a gain control signal indicating a requested gain and a control input receiving a mute control signal indicating whether the signal output should be switched on or switched off. A control unit determines whether the signal output of the power amplifier should be switched on and/or off, and if switched on receives data identifying a switch-on ramp and if switched off receives data identifying a switch-off ramp. The control unit generates the mute control signal to switch on the signal output of the power amplifier on or off, and generates the gain control signal as a function of the data identifying the switch-on or switch-off ramp to thereby increase or decrease the gain control signal.

20 Claims, 17 Drawing Sheets

(51) Int. Cl.
  *H03F 3/19*   (2006.01)
  *H03F 3/21*   (2006.01)
  *H03F 1/02*   (2006.01)
  *H03F 1/30*   (2006.01)
  *H03F 3/189*  (2006.01)
  *H03F 3/45*   (2006.01)
  *H03F 3/72*   (2006.01)
  *H03G 1/00*   (2006.01)

(52) U.S. Cl.
  CPC ..... *H03G 3/3047* (2013.01); *H03F 2200/451* (2013.01); *H03F 2203/7221* (2013.01)

(56) References Cited

U.S. PATENT DOCUMENTS

| | | | |
|---|---|---|---|
| 7,312,660 B2 | 12/2007 | Koh et al. | |
| 7,797,065 B2 * | 9/2010 | Zaucha | H03F 1/12 330/207 A |
| 8,471,629 B2 * | 6/2013 | Thomsen | H03G 3/3042 330/129 |
| 2012/0059265 A1 | 3/2012 | Franchini et al. | |

* cited by examiner

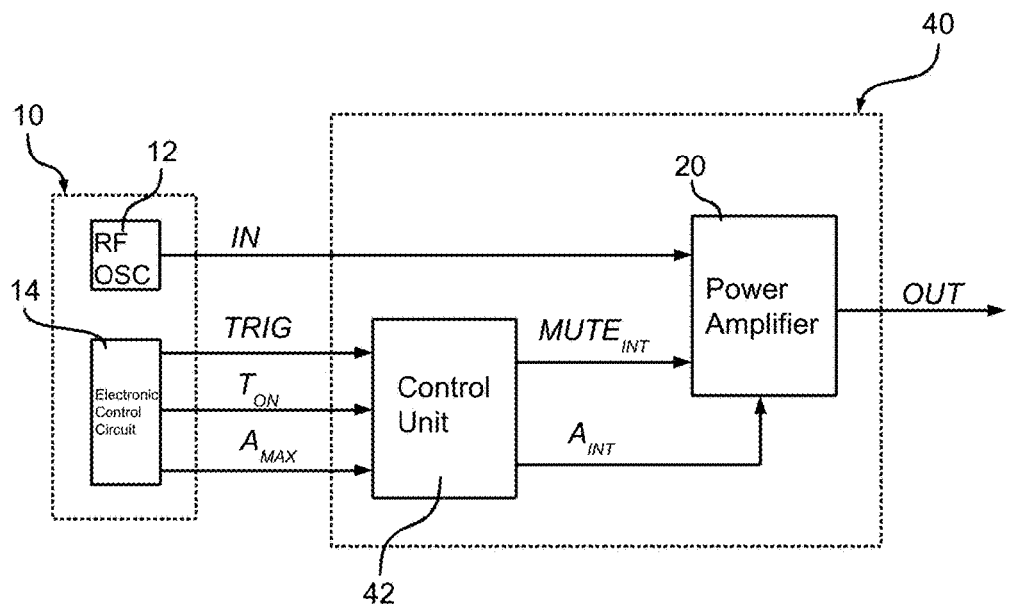
Fig. 9
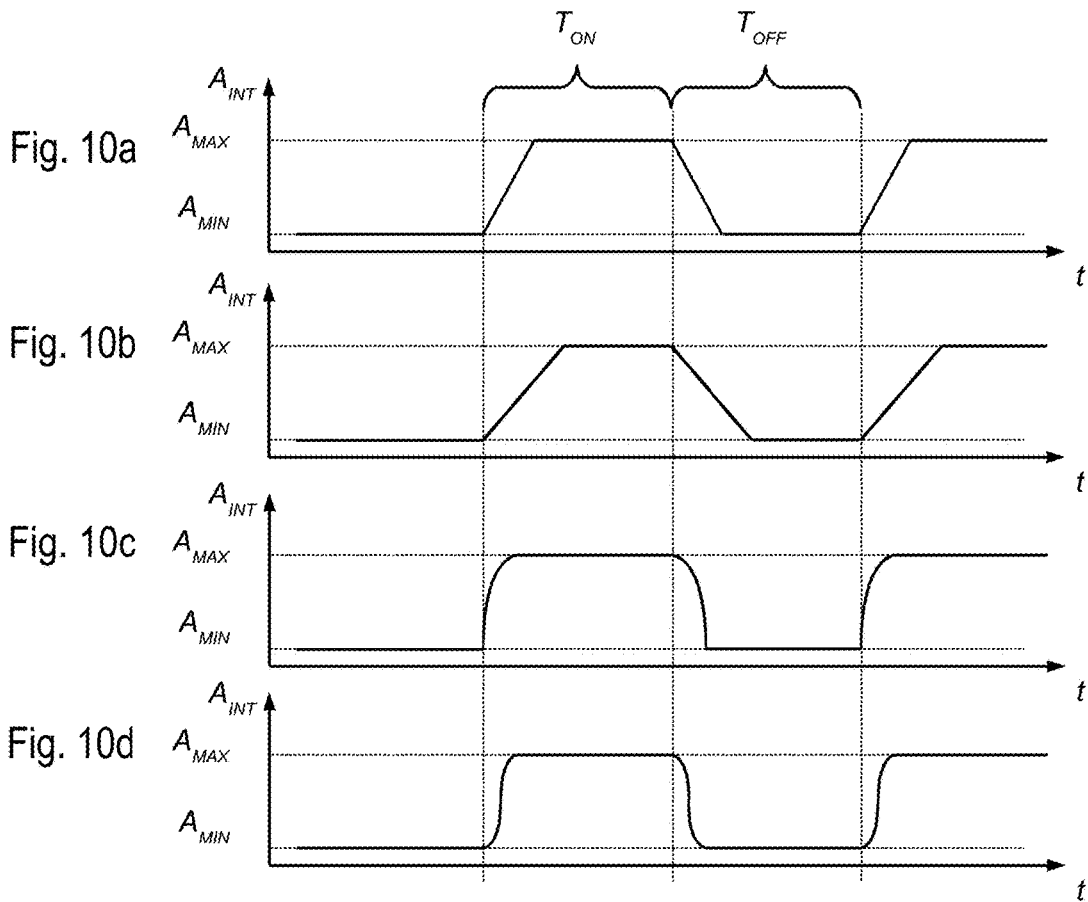
Fig. 10a
Fig. 10b
Fig. 10c
Fig. 10d

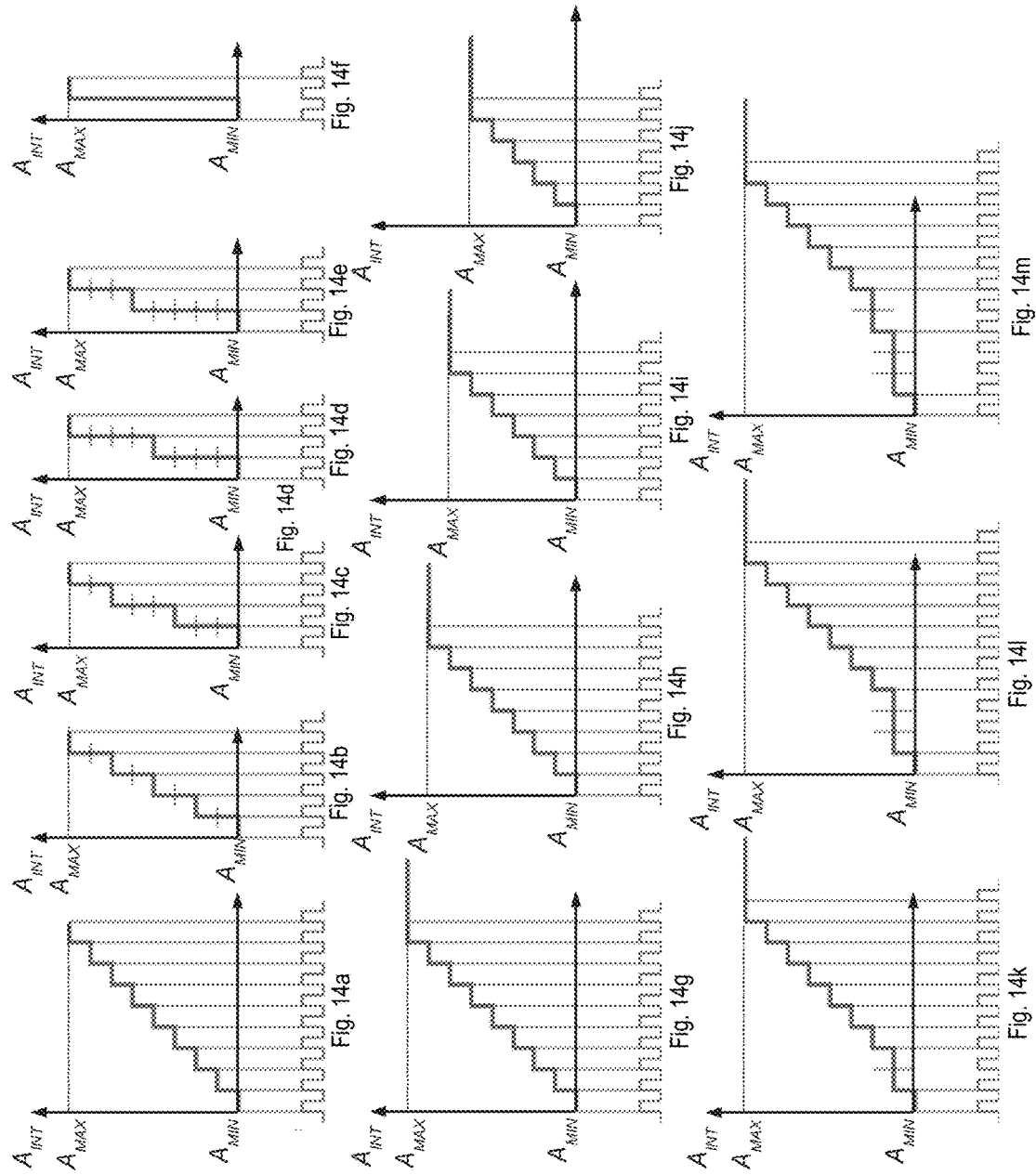

METHOD OF SWITCHING ON AND OFF A POWER AMPLIFIER, RELATED POWER AMPLIFIER CIRCUIT, SYSTEM AND COMPUTER PROGRAM PRODUCT

BACKGROUND

Technical Field

Embodiments of the present disclosure relate to power amplifiers. Specifically, various embodiments of the present disclosure relate to techniques for switching on and off the output of a radio frequency (RF) power amplifier with low spurious emission.

Description of the Related Art

FIG. 1 shows a system including a power amplifier 20 adapted to be used, e.g., for radio frequency (RF) applications, such as radar applications or microwave applications.

In the example considered, the power amplifier 20 includes an input for receiving an input signal IN and an output for providing an output signal OUT. For example, the input signal IN may be an RF signal with a frequency between few MHz and beyond 100 GHz, e.g., 24 or 77 GHz as often used for automotive radar applications.

In the example considered, the power amplifier 20 receives at input also a mute control signal MUTE, which is used to selectively switch-on (enable) or switch-off (disable/mute) the output signal OUT.

For example, in FIG. 1, the signals IN and MUTE are generated by a signal generator circuit 10. For example, the signal IN may be generated by an (RF) oscillator 12, such as an oscillator with controllable frequency, such as a voltage controlled oscillator (VCO). Conversely, the signal MUTE may be generated by an electronic control circuit 14.

For example, FIG. 2 shows a possible driving of the power amplifier 10.

Specifically, in the example considered, the circuit 10 is configured to sweep the frequency $f_{IN}$ of the signal IN between a first frequency $f_1$ and a second frequency $f_2$. For example, in FIG. 2, at a time to the frequency of the signal IN corresponds to $f_1$ and the frequency $f_{IN}$ is increased (e.g., linearly) until the frequency $f_2$ is reached at a time $t_1$. The frequency $f_{IN}$ of the signal IN may then be kept constant, e.g., at the frequency $f_1$, until a time $t_2$ is reached and a new cycle is started, i.e., the cycle end-time $t_2$ corresponds to the cycle start-time $t'_0$ of the following cycle.

In parallel to the generation of the signal IN, the signal generator 10 generates also the signal MUTE, which is synchronized with the sweeping of the frequency $f_{IN}$ of the signal IN. Specifically, in the example considered, the mute signal MUTE is set to:

a first logic level, e.g., low, indicating that the output OUT of the power amplifier 20 should be switched on, when the frequency $f_{IN}$ of the signal IN is varied, i.e., between the instants $t_0$ and $t_1$, and a second logic level, e.g., high, indicating that the output OUT of the power amplifier 20 should be switched off, when the frequency $f_{IN}$ of the signal IN is kept constant, i.e., between the instants $t_1$ and $t_2$.

Accordingly, in the example considered, the output of the power amplifier 20 is switched on during a switch-on period $T_{ON}$ ($t_0$-$t_1$) and switched-off during a switch-off period $T_{OFF}$ ($t_1$-$t_2$), and the operation is repeated periodically.

This is also shown in FIG. 2, in which the power $P_{OUT}$ of the output signal OUT is substantially constant at a maximum level $P_{MAX}$ (assuming a constant amplitude of the input signal IN) during the switch-on period $T_{ON}$ and substantially constant at a minimum level $P_{MIN}$ (assuming again a constant amplitude of the input signal IN) during the switch-off period $T_{OFF}$.

Those of skill in the art will appreciate that the frequency $f_{IN}$ of the signal IN may also be varied during the switch-off period $T_{OFF}$, because the output signal OUT is switched-off. Moreover, also other modulations of the switching frequency $f_{IN}$ and/or the amplitude of the signal IN may be performed.

For example, the above modulation scheme may be used in a 24 GHz Industrial, Scientific and Medical (ISM) radar, where the transmission slots $T_{ON}$ with maximum power $P_{MAX}$ are alternated with mute slots $T_{OFF}$ with minimum power $P_{MIN}$. For example, for ISM applications, the minimum power $P_{MIN}$ should be smaller than $P_{MAX}$-40 dBc, i.e., $P_{MIN} < P_{MAX}$-40 dBc. Moreover, in typical applications, the bandwidth BW=$f_2$-$f_1$ of the frequency sweeping may be in the MHz range, e.g., 200 MHz.

FIG. 3 shows in this regard a block diagram of a differential power amplifier 20 possibly to be used for the above application.

In the example considered, the amplifier 20 is a variable gain amplifier featuring switching function, which permits to implement the 40 dBc of isolation.

Specifically, in the example considered, the amplifier 20 includes a single or multistage variable gain amplifier 24, i.e., the gain of the amplifier stage 24 is settable via a control signal A. For example, such variable gain amplifier 24 may be implemented with a variable reference current source, i.e., the current provided by the reference current source of the current mirror arrangement may be settable as a function of the signal A.

Moreover, in the example considered, the amplifier 20 includes a power amplifier switch 26 configured to enable or disable the output of the amplifier 20 as a function of the mute control signal MUTE.

The amplifier 20 may also include an input buffer 22 possibly used to stabilize the signal IN.

Generally, the control signal A may be digital or analog. For example, in the case where a digital control signal A is used, the amplifier 20 may include a digital-to-analog converter 28, e.g., for generating the control signal for the reference current source of the amplifier stage 24 as a function of the digital signal A. Generally, the amplifier stage 24 may also support directly a digital control. For example, the amplifier stage 24 may include a plurality of current mirror branches and the signal A may be used to selectively enable or disable the current mirror branches, thereby varying the output power of the amplifier stage 24.

Accordingly, in the examples considered, the signal IN is always an oscillating signal and the output signal OUT is activated or deactivated as a function of the signal MUTE.

Unfortunately, this enabling and disabling of the power amplifier 20 creates sharp raising and falling edges in the output signal OUT, which thus generates spurious emissions, i.e., emissions at frequencies being outside the desired range.

For example, considering the driving shown in FIG. 2, spurious emission manifest around $f_1$ (lowest frequency) during a switch-on transition, and around $f_2$ (highest frequency) during a switch-off transition. Conversely, in case a fixed carrier frequency f is used, i.e., $f=f_1=f_2$, spurious emissions are represented by the spectral regrowth around the carrier frequency f during the switch-on and switch-off transitions.

BRIEF SUMMARY

In view of the above, various embodiments of the present disclosure provide solutions for reducing the spurious emissions of a power amplifier during ON/OFF output power transitions.

One or more embodiments are directed to a method of switching on and off a power amplifier and to a related power amplifier circuit and system, as well as a computer-program product, loadable into the memory of at least one processor and including portions of software code capable of implementing the steps of the method when the product is run on at least one processor. Thus as used herein, reference to such a computer-program product is understood to be equivalent to a reference to a computer-readable medium containing instructions for controlling the processing system for coordinating implementation of method according to embodiments of the present disclosure. The reference to "at least one processor" highlights the possibility that the present disclosure may be implemented in a modular form and/or distributed.

The claims are an integral part of the technical teaching of the disclosure provided herein.

As mentioned before, various embodiments of the present disclosure relate to solutions for switching on and off a power amplifier, such as a power amplifier connected to a radio frequency signal generator.

In various embodiments, the power amplifier includes a signal input for receiving an input signal and a signal output for providing an output signal. The power amplifier includes also a control input for receiving a gain control signal being indicative of a requested gain and a control input for receiving a mute control signal indicating whether the signal output of the power amplifier should be switched on or switched off.

In various embodiments, the power amplifier may thus be configured to:
  when the mute control signal indicates that the signal output should be switched on, generating at the signal output an output signal by amplifying the input signal as a function of the gain control signal, and
  when the mute control signal indicates that the signal output should be switched off, deactivating the signal output.

In various embodiments, a control unit is associated with the power amplifier. The control unit may be any analog or digital circuit, such as a microprocessor programmed via software instructions.

Specifically, in various embodiments, the control unit determines whether the signal output of the power amplifier should be switched on. In this case, the control unit obtains, e.g., receives from a memory, data identifying a switch-on ramp. Next, the control unit generates the mute control signal of the power amplifier in order to switch on the signal output of the power amplifier with a first gain value. Next, the control unit generates the gain control signal as a function of the data identifying the switch-on ramp, thereby increasing the gain control signal from the first gain value to a second gain value being greater than the first gain value.

Accordingly, in one embodiment, the power amplifier is switched on with a small first gain and the gain is increased gradually, thereby reducing spurious emissions of the power amplifier.

In addition or in an alternative embodiment, the control unit may determine whether the signal output of the power amplifier should be switched off. In this case, the control unit may receive data identifying a switch-off ramp. Next, the control unit generates the gain control signal as a function of the data identifying the switch-off ramp, thereby decreasing the gain control signal from the second gain value to the first gain value. Next, the control unit generates the mute control signal of the power amplifier in order to switch off the signal output of the power amplifier with the first gain value.

For example, the data identifying the switch-on ramp and/or the switch-off ramp may include data identifying one or more ramp-steps and/or one or more ramp-widths, and the gain control signal may be generated by increasing or decreasing the gain control signal as a function of the one or more ramp-steps and/or one or more ramp-widths.

In various embodiments, the control unit is configured to determine the switch on and switch off by means of a control signal. However, the control signal may also indicate merely a switched on and the control unit may determine internally when the signal output of the power amplifier should be switched off by determining whether a switch-on duration has lapsed since the gain control signal has reached the second gain value at the end of the switch-on ramp.

In various embodiments, the control unit may delay the switching on of the signal output of the power amplifier and/or the generation of the gain control signal with respect to the control signal indicating that the signal output of the power amplifier should be switched on. In addition or in alternative, the control unit may delay the switching off of the signal output of the power amplifier with respect to the decreasing of the gain control signal, in particular the end of the switch-off ramp.

For example, in various embodiments, the control unit includes a first circuit configured to generate a switch-on signal indicating that the signal output of the power amplifier should be switched on as a function of the control signal. Accordingly, the control unit may generate the gain control signal as a function of the data identifying the switch-on ramp when the switch-on signal indicates that the signal output of the power amplifier should be switched on.

Similarly, the first circuit may be configured to generate a switch-off signal indicating that the signal output of the power amplifier should be switched off as a function of the control signal. Accordingly, the control unit may generate the gain control signal as a function of the data identifying the switch-off ramp when the switch-off signal indicates that the signal output of the power amplifier should be switched off. Generally, the control unit may also generate the switch-off signal internally by determining whether a switch-on duration has lapsed since the gain control signal has reached the second gain value at the end of the switch-on ramp.

In various embodiments, the control unit may generate a further switch-off signal when the gain control signal has reached the first gain value at the end of the switch-off ramp.

Accordingly, the control unit may include a second circuit configured to generate the mute control signal of the power amplifier in order to indicate that the signal output of the power amplifier should be switched on when the switch-on signal indicates that the signal output of the power amplifier should be switched on. Similarly, the second circuit may be configured to generate the mute control signal of the power amplifier in order to indicate that the signal output of the power amplifier should be switched off when the further switch-off signal is generated.

For example, in these embodiments, the switching on or the switching off may be delayed by delaying the switch-on signal or delaying the further switch-off signal, respectively, e.g., by means of a timer/counter or as a function of a feedback control signal.

BRIEF DESCRIPTION OF THE SEVERAL VIEWS OF THE DRAWINGS

Embodiments of the present disclosure will now be described with reference to the annexed drawings, which are provided purely by way of non-limiting example and in which:

FIGS. 7, 8a, 8b and 9 show further embodiments of power amplifier circuits in accordance with the present disclosure and signals generated during operation of these power amplifier circuits;

FIGS. 10a to 10d show further details according to an embodiment of the method of FIG. 5;

FIGS. 14a to 14m show further details according to an embodiment of the method of FIG. 5;

FIGS. 15 and 15a to 15f show an embodiment of a power amplifier which may be used in the power amplifier circuits of the present disclosure;

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
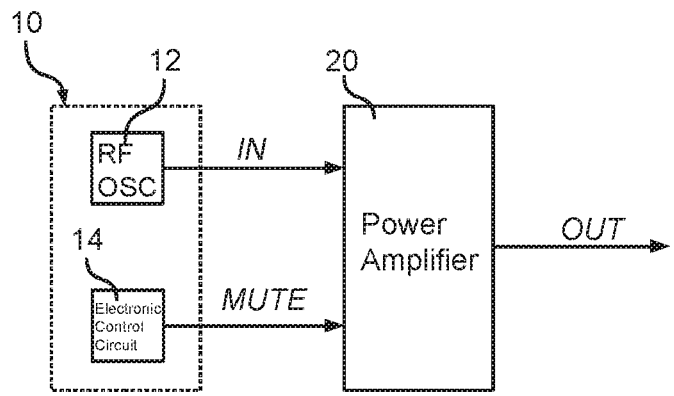
FIG. 1 is a block diagram of a conventional power amplifier.
Figure 2:
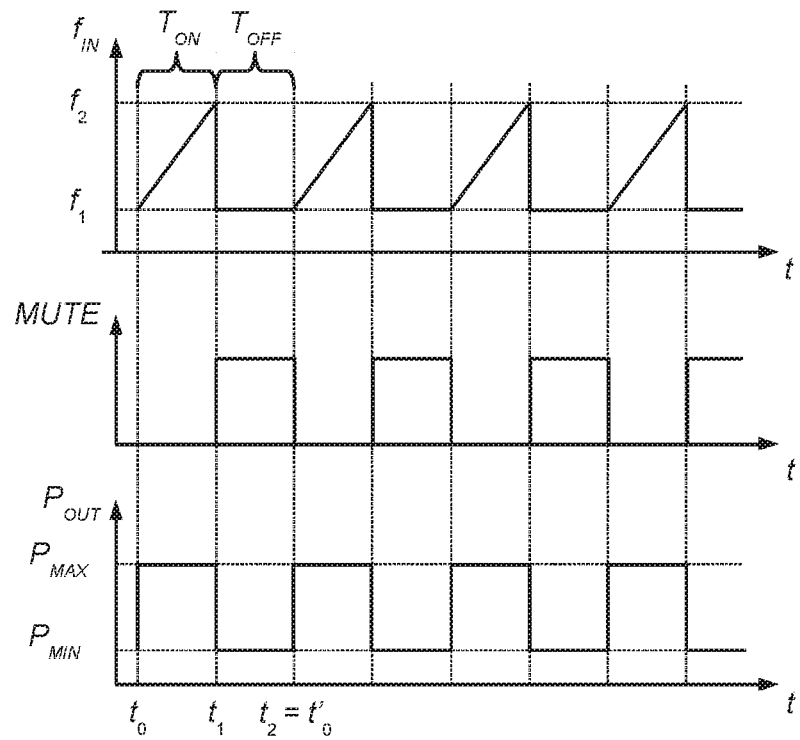
FIG. 2 is a signal diagram showing signals generated in the power amplifier of FIG. 1 during operation of the power amplifier.
Figure 3:
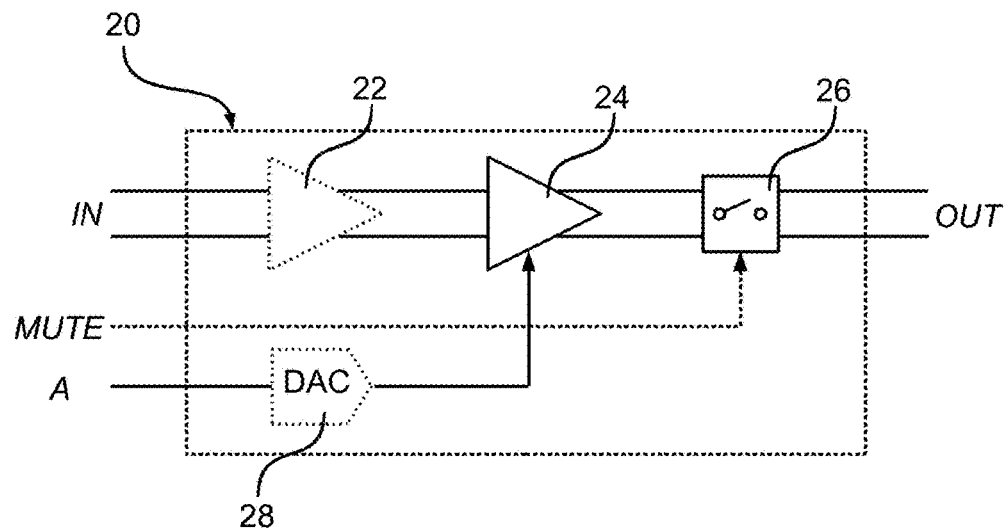
FIG. 3 is a block diagram of a conventional differential power amplifier.

In the following FIGS. 4 to 19 parts, elements or components which have already been described with reference to FIGS. 1 to 3 are denoted by the same references previously used in such figures. The description of such previously described elements will not be repeated in the following in order not to overburden the present detailed description.

As mentioned in the foregoing, various embodiments of the present disclosure relate to solutions for reducing the spurious emissions of a power amplifier.

Figure 4:
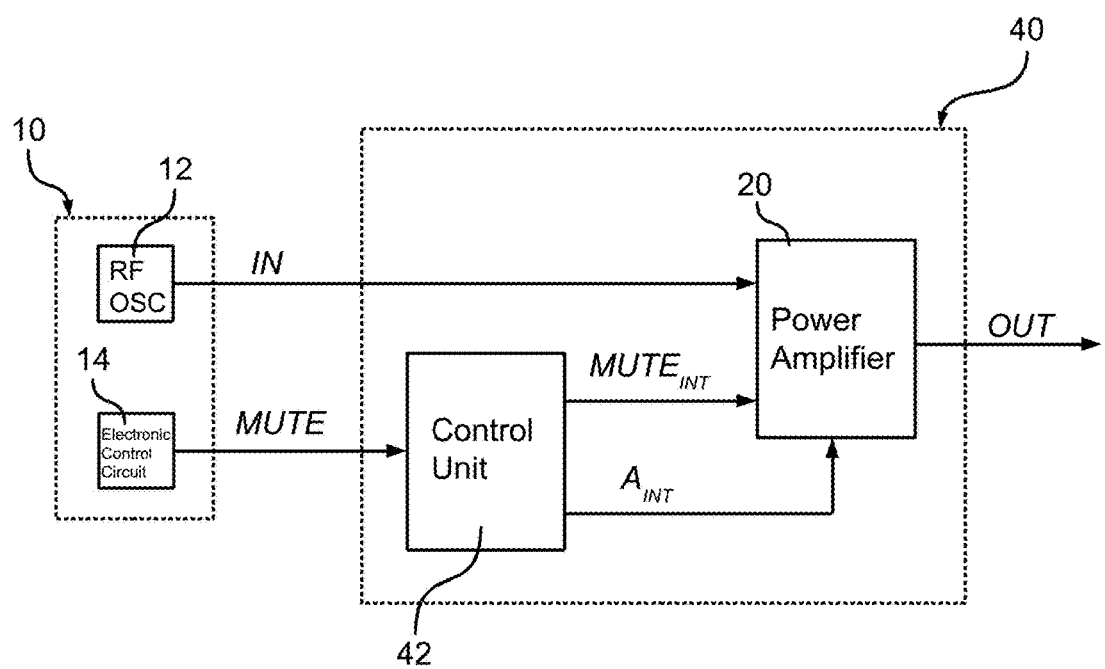
FIG. 4 shows a power amplifier circuit in accordance with an embodiment of the present disclosure.

FIG. 4 shows a power amplifier circuit 40 in accordance with a first embodiment of the present disclosure.

In the embodiment of FIG. 4 being considered, the power amplifier circuit 40 includes a power amplifier 20, such as the power amplifier shown in FIG. 3, and a control unit 42.

Specifically, in the embodiment considered, the power amplifier 20 includes:

an input for receiving a signal IN,
an output for providing a signal OUT,
an input for receiving a mute control signal $MUTE_{INT}$,
an input for receiving at least one control signal $A_{INT}$ for setting the gain of the power amplifier 20.

Specifically, in the embodiment being considered, the power amplifier 20 is configured to operate as follows:

when the mute control signal $MUTE_{INT}$ has a first logic level (e.g., low) indicating that the output of the power amplifier 20 should be switched on, generate at the output OUTa signal by amplifying the signal IN, as a function of the gain specified by the control signal $A_{INT}$; and when the mute control signal $MUTE_{INT}$ has a second logic level (e.g., high) indicating that the output of the power amplifier 20 is switched off, deactivate the output OUT of the power amplifier 20.

In the embodiment considered, the power amplifier circuit 40 includes:

an input for receiving the signal IN,
an output for providing the signal OUT,
an input for receiving a mute control signal MUTE.

Accordingly, in the embodiment being considered, the signal IN provided to the input of the power amplifier circuit 40 is fed directly to the input IN of the power amplifier 20 and the output OUT of the power amplifier 20 corresponds to the output OUT of the power amplifier circuit 40.

Conversely, the signal MUTE provided to the power amplifier circuit 40 is fed to the control unit 42, which is configured to generate the mute control signal $MUTE_{INT}$ and the gain control signal $A_{INT}$ of the power amplifier 20 as a function of the signal MUTE. Generally, the control unit 42 may be any analog and/or digital circuit. For example, in various embodiments, the control unit 42 may be a microprocessor being programmed via software instructions or a custom digital circuit implementing a state machine.

For example, similar to FIG. 1, the signals IN and MUTE may be generated by a signal generator circuit 10. For example, the signal IN may be generated by an oscillator 12, such as an (RF) oscillator with fixed or controllable frequency, such as a voltage controlled oscillator (VCO). Conversely, the signal MUTE may be generated by an electronic control circuit 14. Accordingly, at least part of the control circuit 14 may also be implemented directly within the control unit 42 or vice versa at least part of the control unit 42 may be implemented within the control circuit 14.

Figure 5:
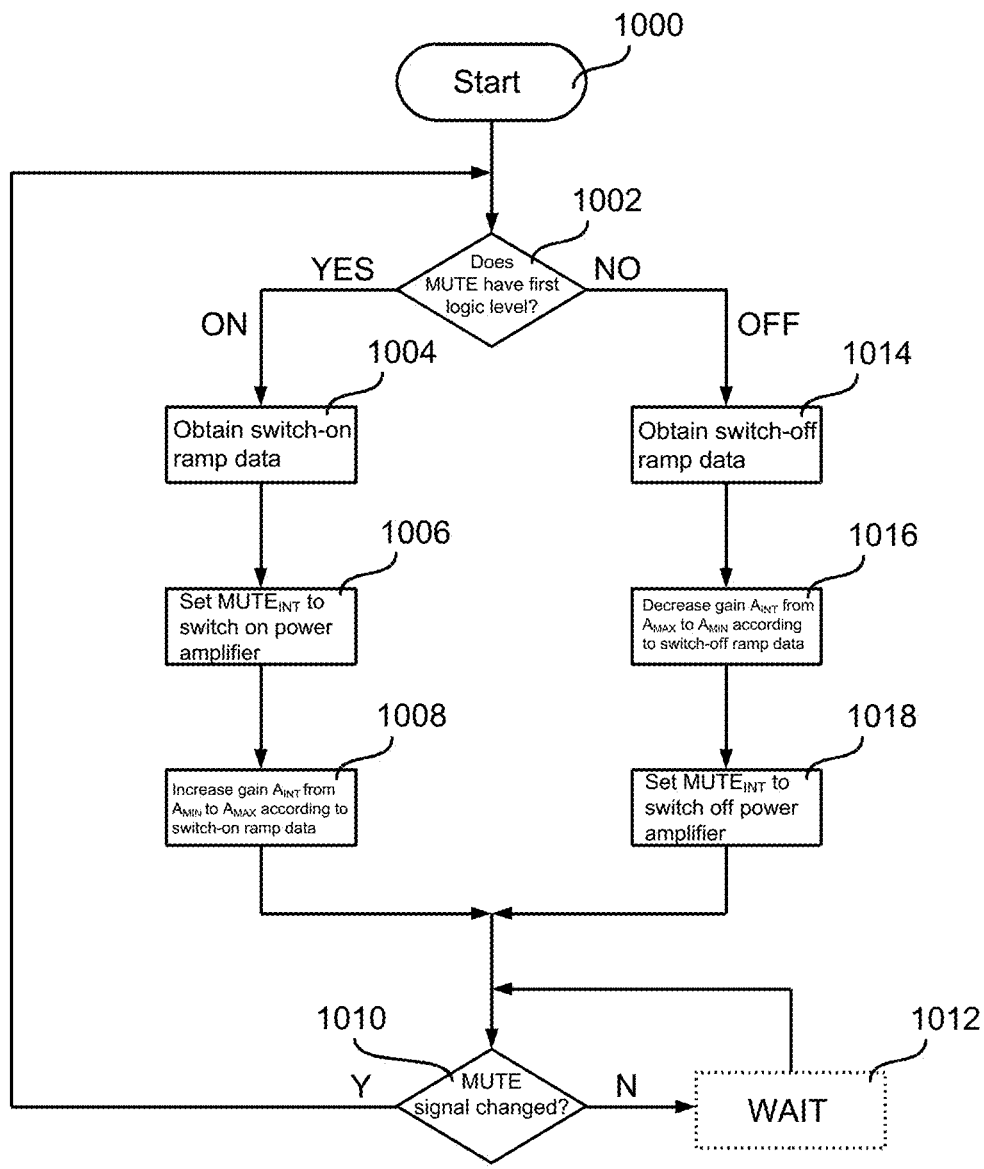
FIG. 5 shows an embodiment of a method of controlling the power amplifier circuit of FIG. 4.
Figure 6A:
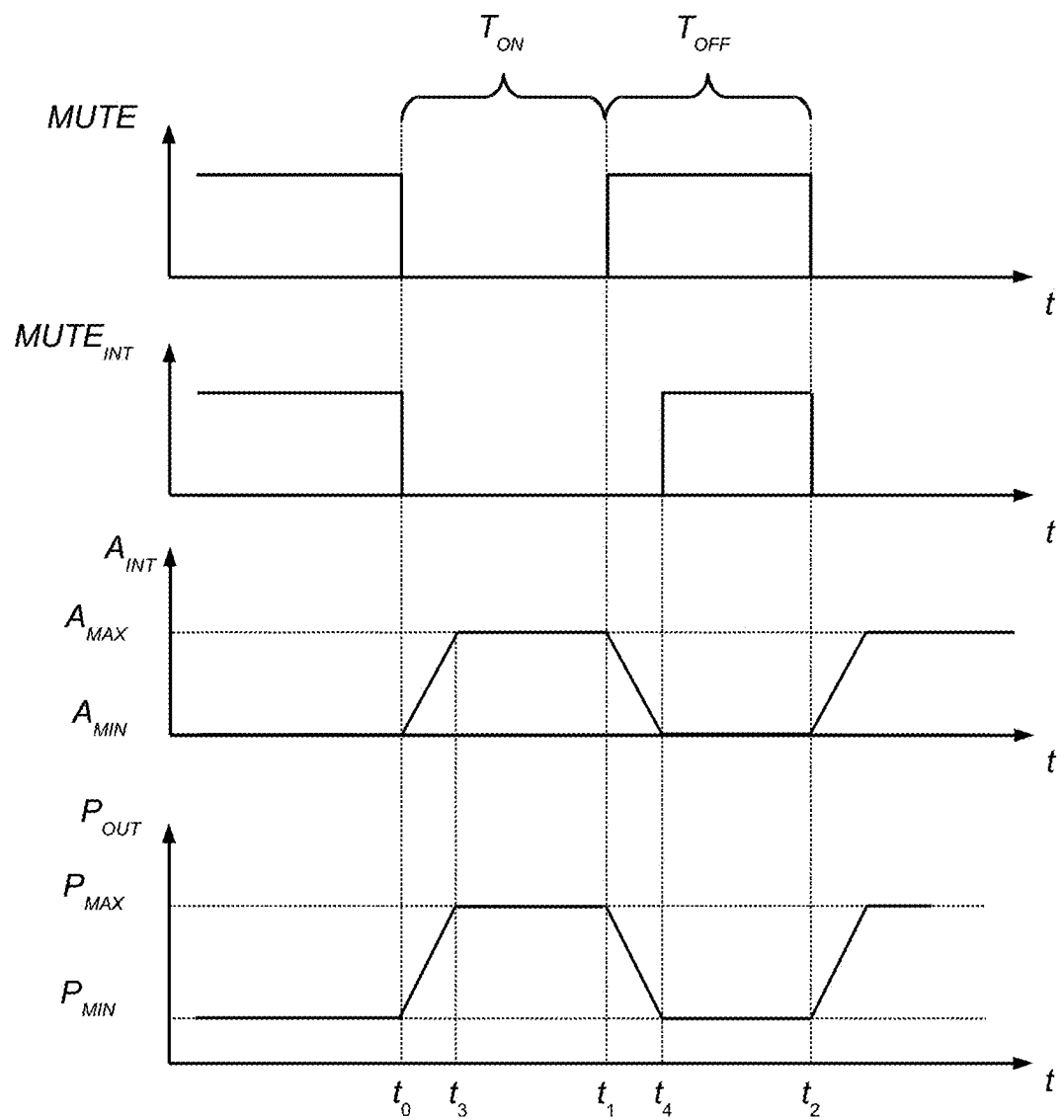
FIGS. 6a and 6b show details according to an embodiment of the method of FIG. 5.
Figure 6B:
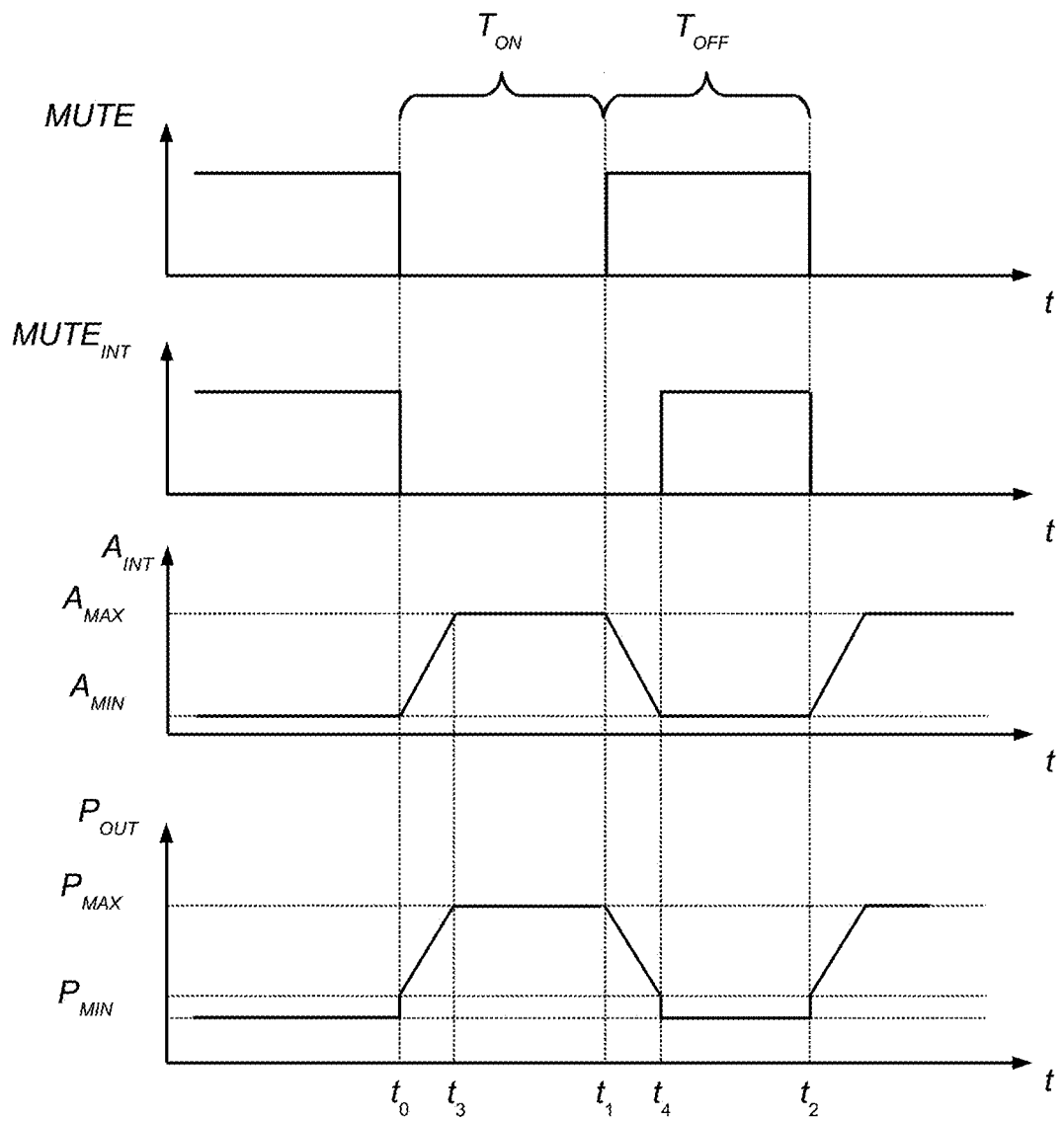

FIG. 5 is a flow chart showing an embodiment of the operation of the control unit 42 and FIGS. 6a and 6b show exemplary waveforms for the signals MUTE, $MUTE_{INT}$ and $A_{INT}$.

Specifically, after a start step 1000, the control unit 42 verifies at a step 1002 whether the signal MUTE has the first logic level indicating that the output of the power amplifier circuit 20 should be switched on or the second logic level indicating that the output of the power amplifier circuit 40 should be switched off.

In case the signal MUTE has the first logic level (output "ON" of the verification step 1002), the process executed by the control unit 42 proceeds to a step 1004, in which the control unit 42 obtains data identifying a switch-on ramp. For example, these data may be stored in a memory or may be identified with a mathematical function. For example, in various embodiments, the switch-on ramp corresponds to a linear increase from a minimum gain $A_{MIN}$ to a maximum gain $A_{MAX}$. Accordingly, the values for $A_{MIN}$ and/or $A_{MAX}$ may be stored in an internal memory or provided to the control unit 42.

For example, in various embodiments (see, e.g., FIG. 6a) the gain $A_{MIN}$ indicates a zero amplification. However, generally (see, e.g., FIG. 6b), the gain $A_{MIN}$ may also indicate a non-zero value. In various embodiments, the gain $A_{MIN}$ corresponds, however, to the smallest settable gain of the power amplifier 20.

Next, the control unit 42 sets at a step 1006 the signal $MUTE_{INT}$ to a first logic level indicating that the output of the power amplifier 20 should be switched on, i.e., the power amplifier 20 is switched on and amplifies the signal IN with $A_{INT}=A_{MIN}$.

The control unit 42 proceeds then to a step 1008, in which the control unit 42 increases the gain signal $A_{INT}$ according to the switch-on ramp from the value $A_{MIN}$ to a given value $A_{MAX}$, i.e., the power amplifier 20 increases the amplification of the signal IN until $A_{INT}=A_{MAX}$. Generally, the gain $A_{MAX}$ may be any gain being greater than the gain $A_{MIN}$. In various embodiments, the gain $A_{MAX}$ corresponds, however, to the highest settable gain of the power amplifier 20.

Accordingly, as shown in FIGS. 6a and 6b when the power amplifier circuit 40 is switched on at a time to by changing the signal MUTE from the second to the first logic level (e.g., from high to low), the control unit 42 switches on the power amplifier 20 by changing the signal $MUTE_{INT}$ from the second to the first logic level (e.g., from high to low) and increases the amplification until the gain $A_{INT}$ reaches $A_{MAX}$ at a time $t_3$.

At a step 1010, the control unit 42 verifies then whether the signal MUTE changes.

In case the signal MUTE does not change (output "NO" of the verification step 1010), the control unit 42 returns to the step 1010, possibly via a wait step 1012.

Conversely, in case the signal MUTE changes (output "YES" of the verification step 1010), the control unit 42 returns to the step 1002.

Accordingly, in case the signal MUTE has now the second logic level (output "OFF" of the verification step 1002), the control unit 42 proceeds to a step 1014, in which the control unit 42 obtains data identifying a switch-off ramp. Again, these data may be stored in a memory or may be identified with a mathematical function. For example, in various embodiments, the switch-off ramp corresponds to a linear decrease from a maximum gain $A_{MAX}$ to a minimum gain $A_{MIN}$.

The control unit 42 proceeds then to a step 1016, in which the control unit 44 decreases the gain signal $A_{INT}$ according to the switch-off ramp from the value $A_{MAX}$ to the value $A_{MIN}$, i.e., the power amplifier 20 decreases the amplification of the signal IN until $A_{INT}=A_{MIN}$.

Next, the control unit 42 sets at a step 1018 the signal $MUTE_{INT}$ to the second logic level indicating that the output of the power amplifier 42 should be switched off, i.e., the power amplifier 20 is switched off with $A_{INT}=A_{MIN}$.

Accordingly, as shown in FIGS. 6a and 6b, once the power amplifier circuit 40 is switched off at a time $t_1$ by changing the signal MUTE from the first to the second logic level (e.g., from low to high), the control unit 42 will decrease the amplification from $A_{MAX}$ to $A_{MIN}$ and only then the power amplifier 20 is switched off at a time $t_4$ by changing the signal $MUTE_{INT}$ from the first to the second logic level (e.g., from low to high).

Finally, the control unit 42 proceeds again to the step 1010 for verifying whether the signal MUTE changes again.

Accordingly, in the embodiment being considered, the power amplifier circuit 40 is smoothly switched on and off by varying the gain of the power amplifier 20, thereby reducing spurious emissions.

Generally, as shown in FIG. 6b, which especially applies when the gain $A_{MIN}$ does not correspond to a zero gain, the output power $P_{OUT}$ may have a small step-like decrease at the instant $t_4$, when the output of the power amplifier 20 is switched off via the signal $MUTE_{INT}$.

In various embodiments, the gain values $A_{MAX}$ and $A_{MIN}$ are fixed or configured within the control unit 42. For example, in case of analog signals, the values $A_{MAX}$ and/or $A_{MIN}$ may be set via a voltage reference or a simple voltage divider. Conversely, in case of digital signals, the values $A_{MAX}$ and/or $A_{MIN}$ may be stored in a memory. Instead, in other embodiments, the control unit 42 may include an input for receiving the (digital or analog) gain values $A_{MAX}$ and/or $A_{MIN}$.

Figure 7:
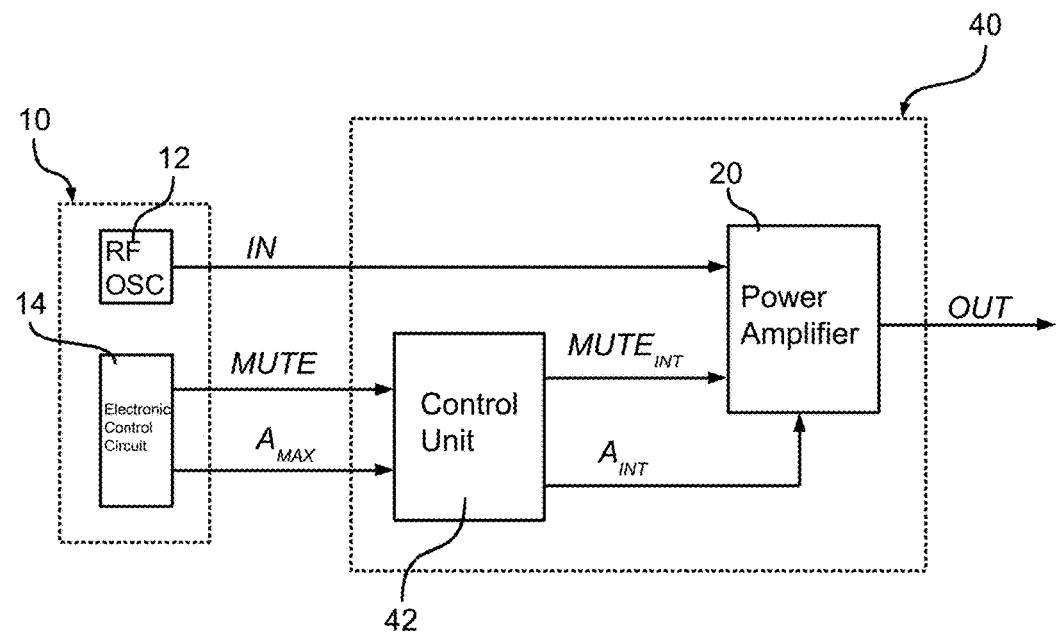

For example, FIG. 7 shows an embodiment, in which the gain value $A_{MIN}$ may be fixed, e.g., to the minimum gain of the power amplifier 20, and the gain value $A_{MAX}$ may be provided to the power amplifier circuit 40, e.g., by the signal generator 10.

Moreover, instead of using an on/off mute control signal MUTE, also other types of signals may be used to switch on and off the output of the power amplifier circuit.

Figure 8A:
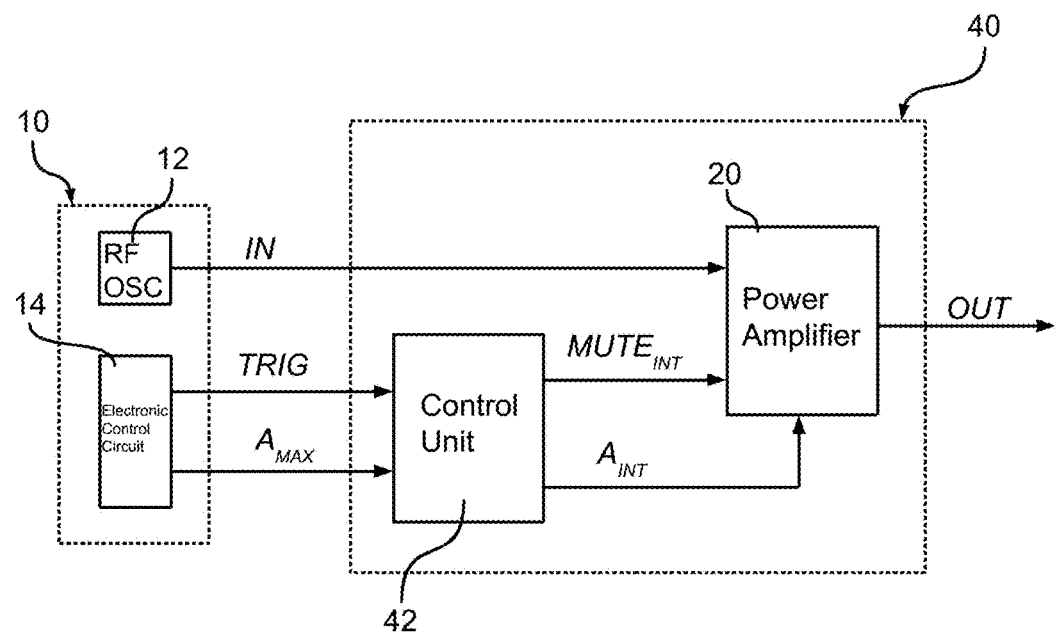
Figure 8B:
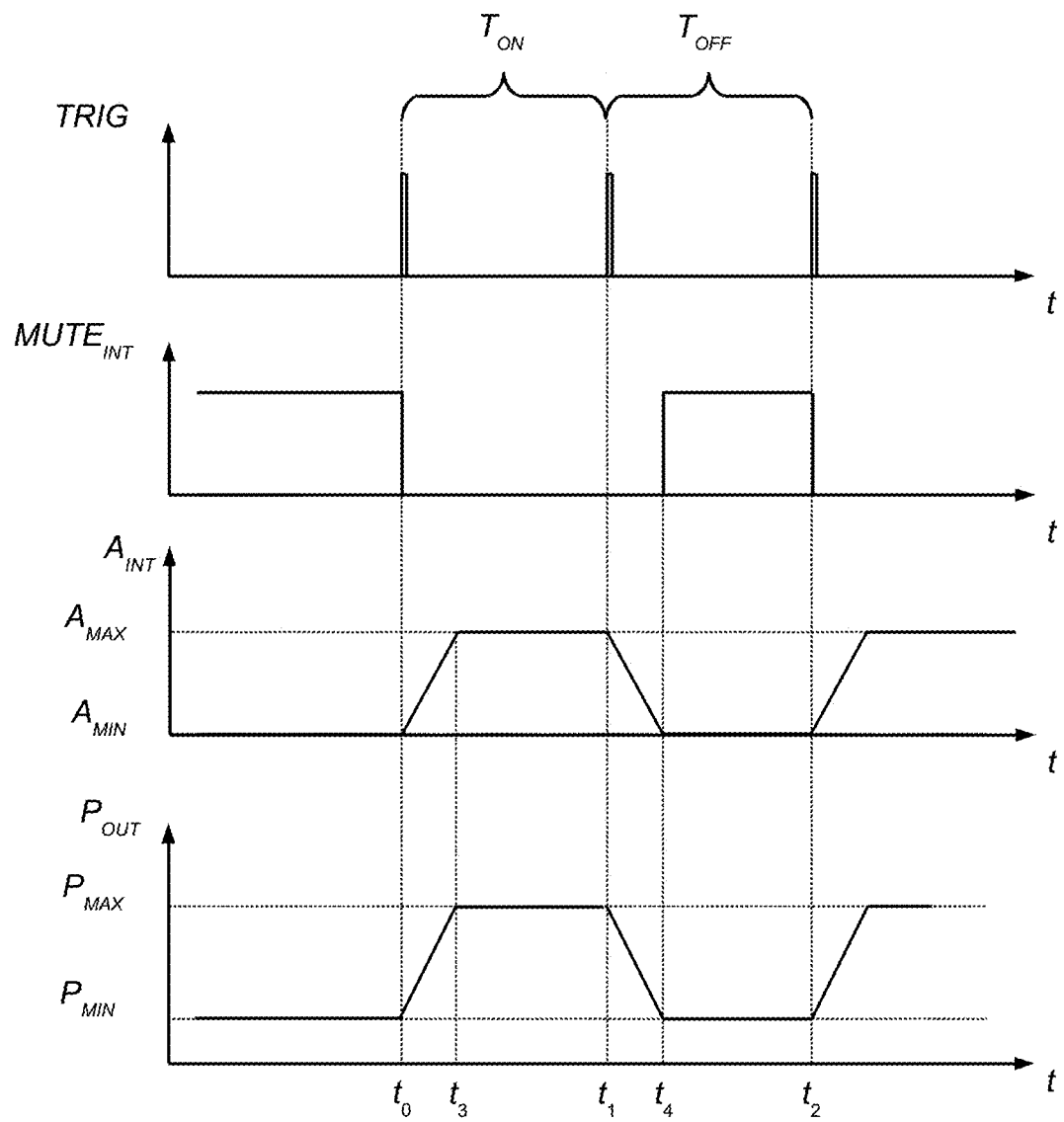

For example, FIG. 8a shows an embodiment, in which a trigger signal TRIG is used. For example, as shown in FIG. 8b, this trigger signal TRIG may be set to high for a brief time interval, each time the output of the power amplifier circuit 20 should be switched.

For example, in this case, the control unit 42 may perform alternatively the steps 1004-1008 or 1014-1018 each time a trigger in the signal TRIG is detected. For example, this can be achieved by monitoring the signal TRIG at the step 1010 in FIG. 5, and the signal $MUTE_{INT}$ at the step 1002.

For example, in this case the control unit 42 may be configured to:

- in case no trigger is detected in the signal TRIG at the step 1010, return to the step 1010 (possibly via the optional wait step 1012), and
- in case a trigger is detected in the signal TRIG at the step 1010, return to the step 1002.

Conversely, at the step 1002, the control unit 42 may:

- proceed to the step 1004, in case the mute control signal $MUTE_{INT}$ is currently set to the second logic level indicating that the output of the power amplifier 20 is currently switched off, and
- proceed to the step 1014, in case the mute control signal $MUTE_{INT}$ is currently set to the first logic level indicating that the output of the power amplifier 20 is currently switched on.

As mentioned before, the control unit 42 may also implement at least part of the control circuit 14. For example, FIG. 9 shows an embodiment, wherein the signal TRIG indicates only the start of a new cycle and the control unit 42 receives (e.g., from a memory or the control circuit 14) data being indicative of the switch-on duration $T_{ON}$.

In the previous embodiments, the operation of the control unit 42 is thus synchronized with the operation of the signal generator 10, e.g., with the frequency sweeping operation performed by the circuit 12. However, in case no modulation of the signal IN is performed, the control unit 42 may also operate independently from the control circuit 14. For example, in this case, the control unit 42 may directly receive signals being indicative for the switch-on duration $T_{ON}$ and the switch-off duration $T_{OFF}$, such as a signal being indicative of the duty cycle to be used.

Moreover, in the previous embodiments, the amplitude of the internal gain signal $A_{INT}$ is varied linearly at the steps 1008 and 1016. However, generally also any other profiles may be used.

For example, FIG. 10a shows the wave-form of the signal $A_{INT}$, as shown in FIG. 6b. FIG. 10b shows that the waveform may also use a greater/smaller gradient (i.e., increase/decrease rate) and FIGS. 10c and 10d show two arbitrary rising and falling profiles for the signal $A_{INT}$.

As described in the foregoing, the control unit 42 may thus receive data identifying the rising profile/ramp between the instants $t_0$ and $t_3$ (FIG. 6b) and/or the falling profile/ramp between the instants $t_1$ and $t_4$ (FIG. 6b). For example, in the embodiments shown in FIGS. 7, 8 and 9, these profiles of the signal $A_{INT}$ were specified via the maximum value $A_{MAX}$ (and possibly the minimum value $A_{MIN}$) and the increase/decrease rates used at the steps 1008/1016 were fixed.

As mentioned in the foregoing, the control unit 42 may be any analog and/or digital circuit.

Figure 11:
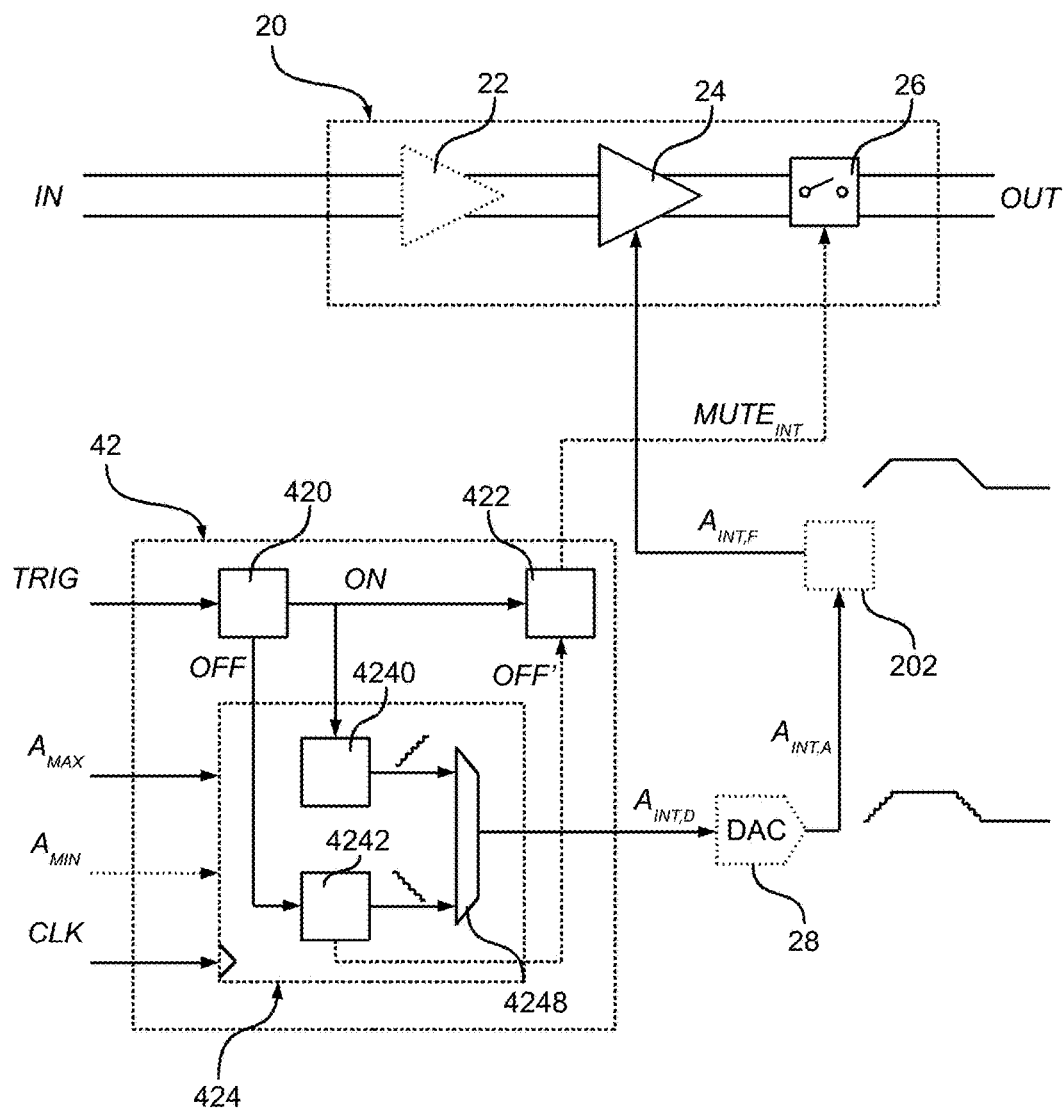
FIGS. 11, 12, 13a and 13b show further embodiments of power amplifier circuit in accordance with the present disclosure and signals generated during operation of these power amplifier circuits.

FIG. 11 shows a first embodiment of a digital control unit 42, which may be used, e.g., in the embodiment shown in FIG. 8, in which the trigger signal TRIG contains a trigger each time the output of the power amplifier circuit 40 should be turned on or turned off.

For example, in the embodiment considered, the control unit 42 includes a trigger detector 420 configured to determine a trigger in the signal TRIG. Specifically, the trigger detector 420 may generate two signals ON and OFF indicating whether the output OUT should be switched on or switched off, respectively. Accordingly, the trigger detector 420 implements steps 1002 and 1010 of FIG. 5. A similar behavior may thus also be reached by implementing the steps 1002 and 1010 in the trigger detector 420 also for a mute signal MUTE.

As shown in FIG. 5, in case the output OUT should be switched on, the signal $MUTE_{INT}$ should switch on the output of the power amplifier 20 (step 1006) and increase the gain $A_{INT}$ from $A_{MIN}$ to $A_{MAX}$ (step 1008). For example, the step 1006 is implemented by a switching block 422 configured to set the signal $MUTE_{INT}$ to the first logic level for switching on the output OUT of the power amplifier 20 when the signal ON is set, e.g., to high. Conversely, the step 1008 is implemented by a counter block 424 configured to generate a digital count value corresponding to a digital gain signal $A_{INT,D}$ in accordance with a clock signal CLK. Specifically, this counter block 424 is configured to increase the digital gain signal $A_{INT,D}$ until $A_{INT,D}=A_{MAX}$ when the signal ON is set, thereby implementing step 1008. Conversely, this counter block 424 is configured to decrease the digital gain signal $A_{INT,D}$ until $A_{INT,D}=A_{MIN}$ when the signal OFF is set, thereby implementing also the step 1016.

In the embodiment being considered, the counter block 424 generates also an end-signal OFF' indicating that the digital gain signal $A_{INT,D}$ has reached $A_{MIN}$, thereby indicating the end of the step 1016. This signal OFF' may thus be used by the switching block 422 in order to set the signal $MUTE_{INT}$ to the second logic level for switching off the output OUT of the power amplifier 20 when the signal OFF' is set.

Accordingly, the switch block 422 implements both the step 1006 and the step 1018 of FIG. 5. For example, the block 422 may be implemented with a set-reset (SR) flip-flop.

Generally, the counter 424 block may be implemented with a single up-and-down counter. Conversely, FIG. 11 shows an embodiment in which an up-counter 4240, a down-counter 4242 and a multiplexer 4248 are used. For example, the up-counter 4240 may be reset and enabled as a function of the signal ON. Conversely, the down-counter 4240 may be reset and enabled as a function of the signal OFF. Finally, the multiplexer 4248 receives at input the count values from the counters 4240 and 4242 and the selection may be driven either by the signal ON or the signal OFF.

In the embodiment being considered, the digital gain signal $A_{INT,D}$ is provided to a digital-to-analog converter 28 configured to generate a corresponding analog gain signal $A_{INT,A}$. As mentioned in the foregoing, the D/A converter (DAC) 28 may also be part of the power amplifier 20.

In various embodiments, the analog gain signal $A_{INT,A}$ may be filtered by a filter 202, such as a low-pass filter. Accordingly, the filter 202 will generate a filtered version of the analog gain signal $A_{INT,F}$ of the analog gain signal $A_{INT,A}$, which may then be used by the power amplifier 20. For example, the filter 202 may be useful in order to generate a smoother gain signal, which does not include the digital steps of the digital-to-analog conversion. Accordingly, from a spectral point of view, the filter 202 filters the spurs generated by the control circuit 42, in particular the clock signal CLK, around the carrier at offsets equal to clock frequency and its harmonics.

Generally, also in this case, the minimum gain $A_{MIN}$ and/or the maximum gain $A_{MAX}$ may be fixed or provided to the control unit 42.

Figure 12:
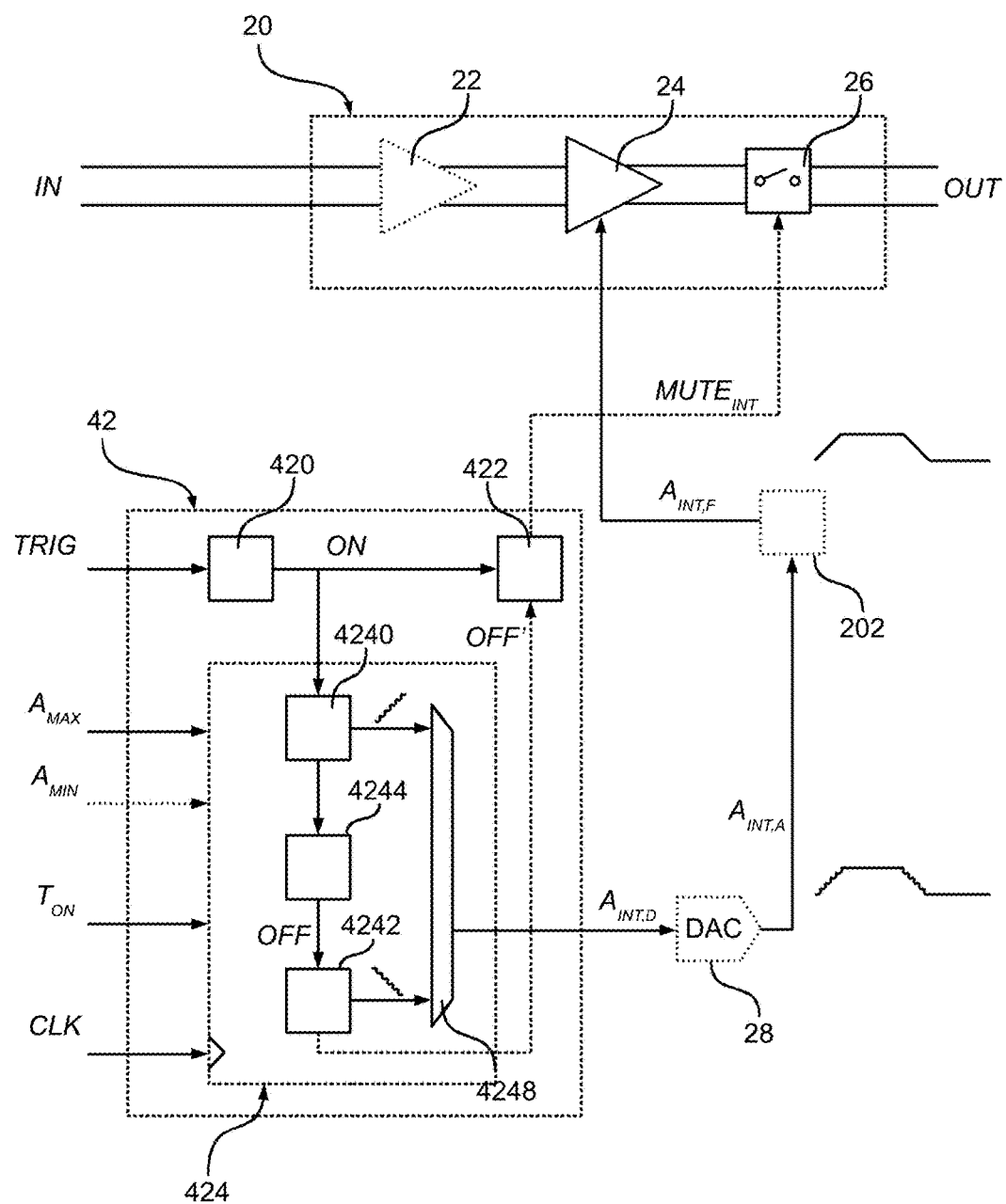

FIG. 12 shows a second embodiment of the control unit 42, which may be used, e.g., in the embodiment shown in FIG. 9, in which the trigger signal TRIG contains a trigger each time a new cycle should be performed.

Specifically, in this case, the block 420 generates a signal ON, when the signal TRIG contains a trigger. This signal is then used by the switching block 422, as in FIG. 11, in order to switch-on the output OUT of the power amplifier 20.

Moreover, also in this case, the signal ON is used by the counter block 424 in order create the rising ramp of the digital gain signal $A_{INT,D}$. However, due to the fact that the signal OFF is not provided by the block 420, the counter block 424, determines internally, whether the switch-on duration $T_{ON}$ has lapsed. For example, as shown in FIG. 12, when the digital gain signal $A_{INT,D}$ reaches the maximum gain $A_{MAX}$, the counter block 424 may perform a second count operation (schematically shown by a further counter 4244), which counts until a count value being proportional to the switch-on duration $T_{ON}$ is reached. Once the count value has been reached, the counter 4244 may generate the signal OFF, which signals to the down-counter 4242 that the switch-off profile has to be generated.

Accordingly, in the embodiment considered, the switch-off phase is started automatically, when the counter block 424 determined internally that the switch-on duration $T_{ON}$ has finished.

Figure 13A:
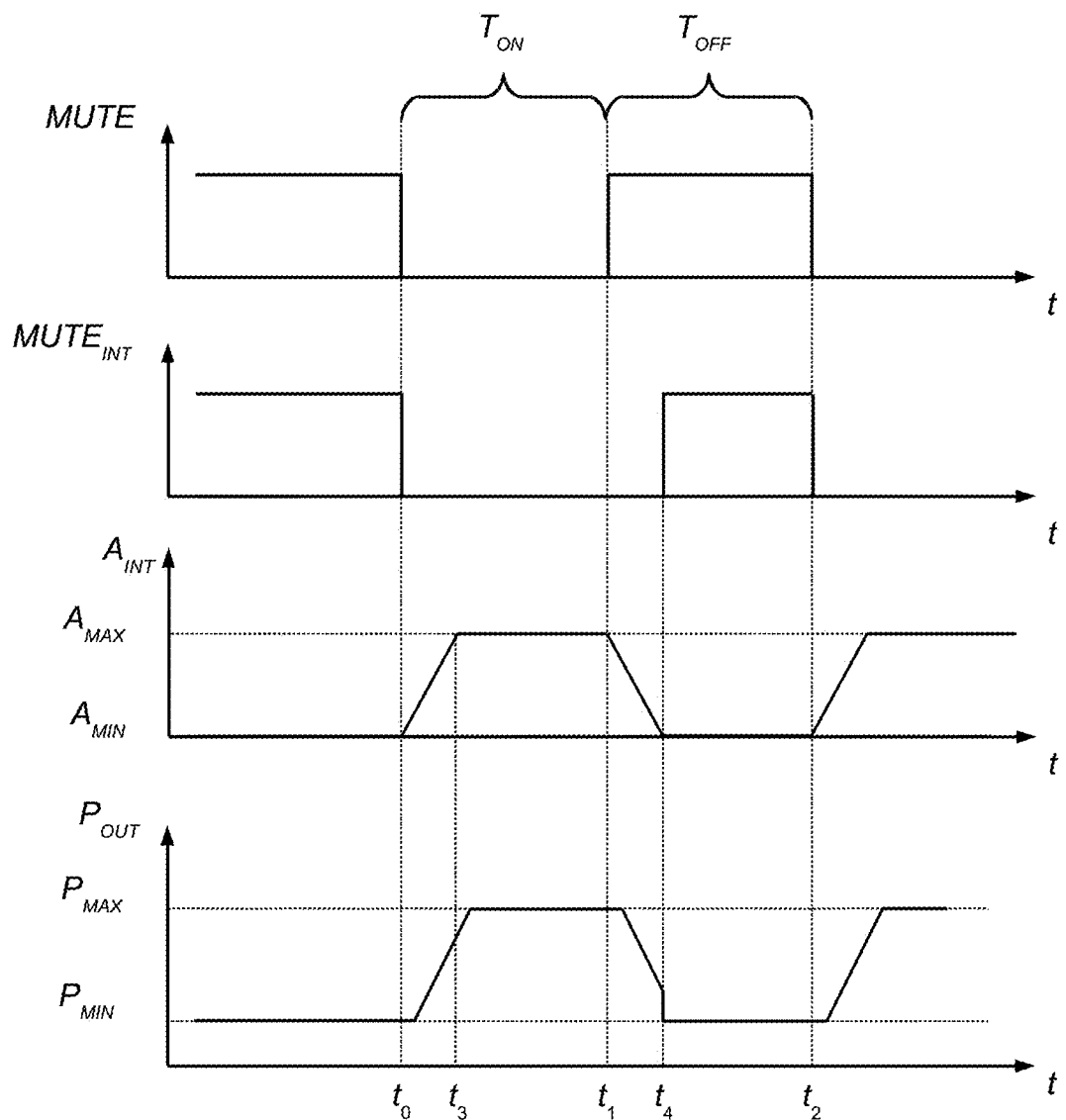

Generally, the A/D converter 28, the filter 202 and/or the power amplifier 20 may introduce a delay in the transfer of the gain $A_{INT}$ to the output OUT, or is at least slower than the actuation of the mute control signal $MUTE_{INT}$. Accordingly, as shown in FIG. 13a, it is likely, that the output will be switched off at the instant $t_4$, while the output power $P_{OUT}$ is still decreasing.

Accordingly, the control unit 42 may introduce a delay in the mute control signal $MUTE_{INT}$ in order to compensate this behavior.

Figure 13B:
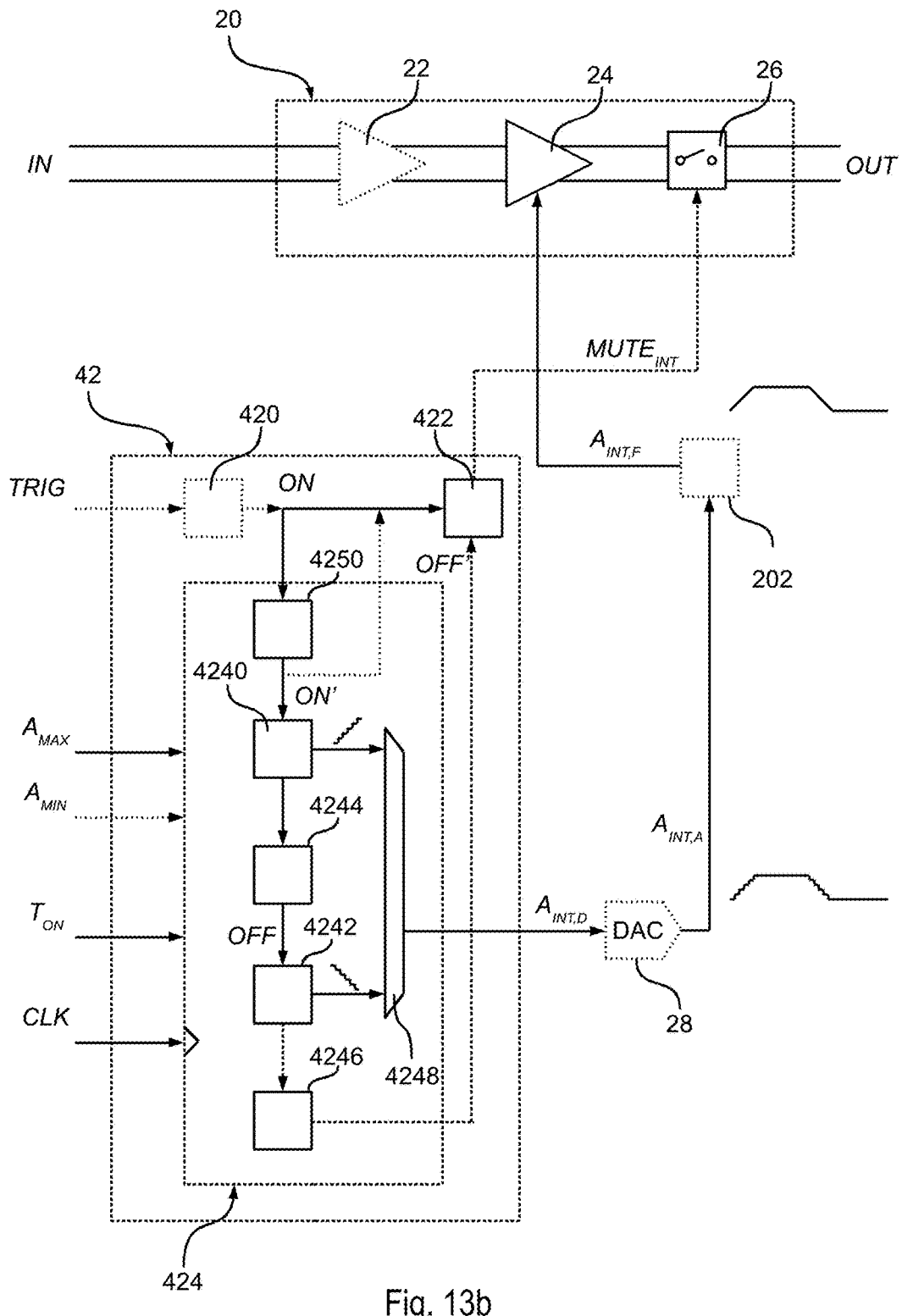

For example, FIG. 13b shows an embodiment, in which the counter block 424 determines internally (once the falling ramp has been generated) that a switch-off delay duration has finished. For example, in the embodiment considered a further switch-off delay counter 4246 is used for this purpose, which is started when the counter 4242 has reached the minimum gain value $A_{MIN}$. For example, the signal OFF' may be generated by this switch-off delay counter 4246, which thus signals to the block 422 that the power amplifier 20 may be switched off when the switch-off delay counter 4246 reaches a count value being proportional to the desired switch-off delay.

Generally, a similar delay may also be used in order to delay the rising ramp. For example, this may be achieved by a further switch-on delay counter 4250 before the counter block 4240, i.e., the counter 4240 is not driven directly by the signal ON but a delayed version ON' thereof which is generated by the counter 4250. For example, this may be useful in case the gain may not be increased immediately at the instant to, e.g., in case the power amplifier 20 requires a given time until the output power is stable. As will be disclosed later, generally, the switching block 422 may also use the delayed switch on signal ON' instead of the signal ON, thereby delaying also the switch-on of the output via the mute control signal $MUTE_{INT}$.

Generally, the maximum count values of the counters 4246 and/or 4250, i.e., the delays introduced, may be fixed or settable.

As mentioned with respect to FIG. 11, the counter block 424 does not have to implement necessarily a single step counting operation.

In fact, in various embodiments, the counter block 424 is configured in order to set for a plurality of counting steps the increase/decrease, i.e., the ramp step, and/or the number of clock cycles of the counting step, i.e., a step width. For example, the step-width may be specified by specifying a ramp-step of zero for one or more counting steps. For example, the values for the various ramp steps and/or step widths may be stored in a memory within the control unit 42. Generally, these values may also be programmed, e.g., by means of the control circuit 14 of the signal generator 10.

FIGS. 14a to 14m show possible switch-on profiles, which may be obtained with the circuits described in the foregoing.

For example, FIGS. 14a to 14f show different ramp steps. Specifically, in FIG. 14a, the ramp-step is fixed to one for all count steps. Conversely, in FIGS. 14b, 14d, and 14f the ramp step is set to two, four or $A_{MAX}$, respectively.

Conversely, FIGS. 14c and 14e show that the ramp-step may also be different for the various steps, such as the steps (3, 3, 2) in FIG. 14c and (5, 3) in FIG. 14e. Generally, the ramp-step may also in this case be fixed, but the counter block 424 may limit the gain $A_{INT}$ to the maximum value $A_{MAX}$.

This is also shown in FIGS. 14g to 14j, in which the ramp-step is fixed to one, while only the maximum gain $A_{MAX}$ is varied.

Finally, FIGS. 14k to 14m show that also the ramp-width may be adapted. For example, in FIG. 14k the ramp-width of the second count step is set to two and in FIG. 14l to three. As mentioned in the foregoing this may be obtained by specifying a ramp-width or by setting the ramp-step to zero for one or more count steps. For example, the ramp shown in FIG. 14k could have the following profile: (1, 0, 1, 1, 1, 1, 1, 1, 1). Conversely, the ramp shown in FIG. 14m could have the following ramp profile: (1, 0, 0, 1, 0, 1, 1, 1, 1, 1, 1).

Generally, by specifying the ramp-step for each count step, it is also not necessary to specify the maximum gain value $A_{MAX}$, which corresponds in this case to the count value reached at the last count step.

Evidently, the same behavior may also be used for the switch-off profile. Moreover, as mentioned in the foregoing, the ramp profiles may be specified with any other suitable data able to identify the switch-on and switch-off profiles. For example, the data may also contain directly the values of $A_{INT}$, e.g., (2, 4, 6, 8) for the embodiment shown in FIG. 14b.

Finally, in the embodiments considered in the foregoing, the gain value $A_{INT}$ is set to the minimum value $A_{MIN}$ when the output of the power amplifier 20 is switched off via the internal mute signal $MUTE_{INT}$. However, in general, the gain value $A_{INT}$ may also be set to other values in this case, e.g., to the maximum gain $A_{MAX}$.

Figure 15:
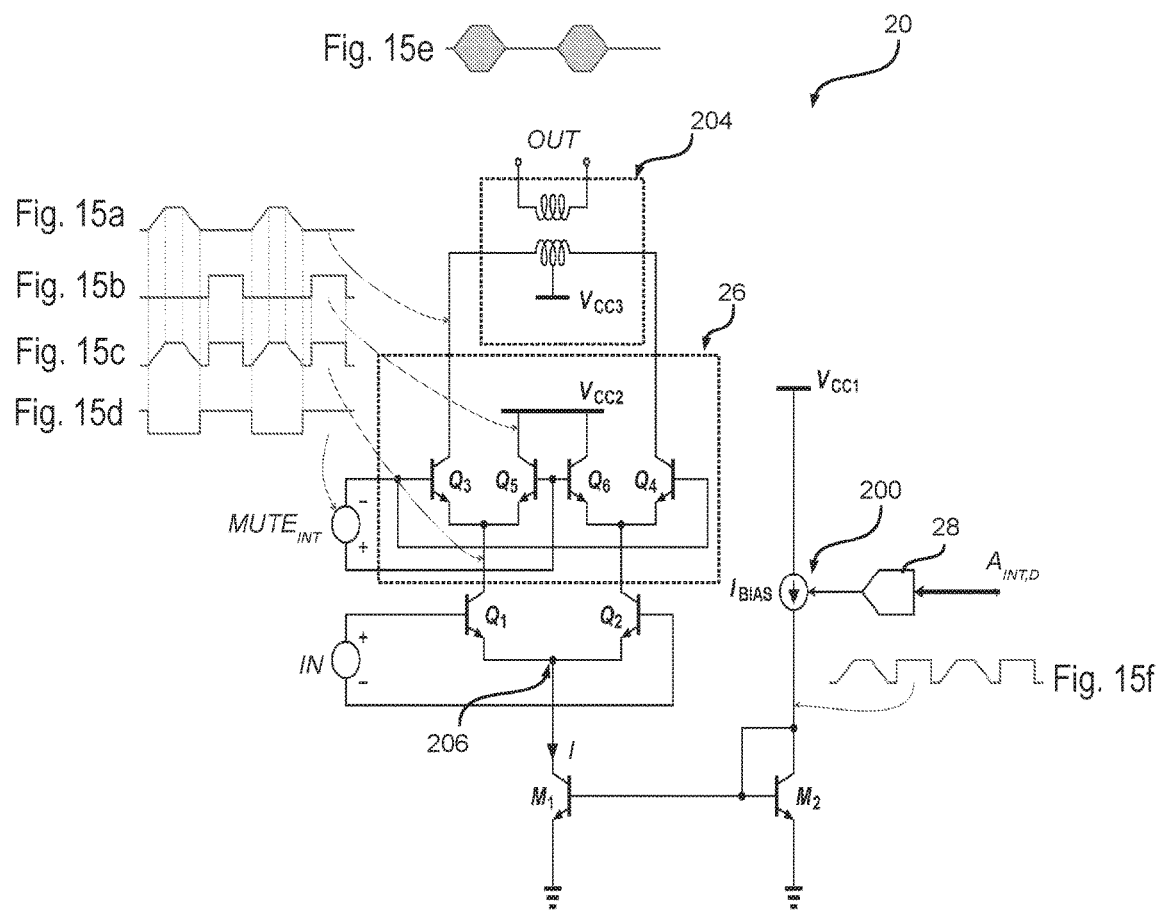

For example, this may be useful for a power amplifier 20 as shown in FIG. 15.

Specifically, in the embodiment being considered, the power amplifier includes a variable current source 200 configured to generate a current $I_{BIAS}$ as a function of the gain signal $A_{INT}$. For example, in the embodiment being considered, the current source 200 is driven via a D/A converter 28 (and as shown in FIGS. 11, 12 and 13 an optional filter 202) by means of a digital gain signal $A_{INT,D}$.

Figure 16:
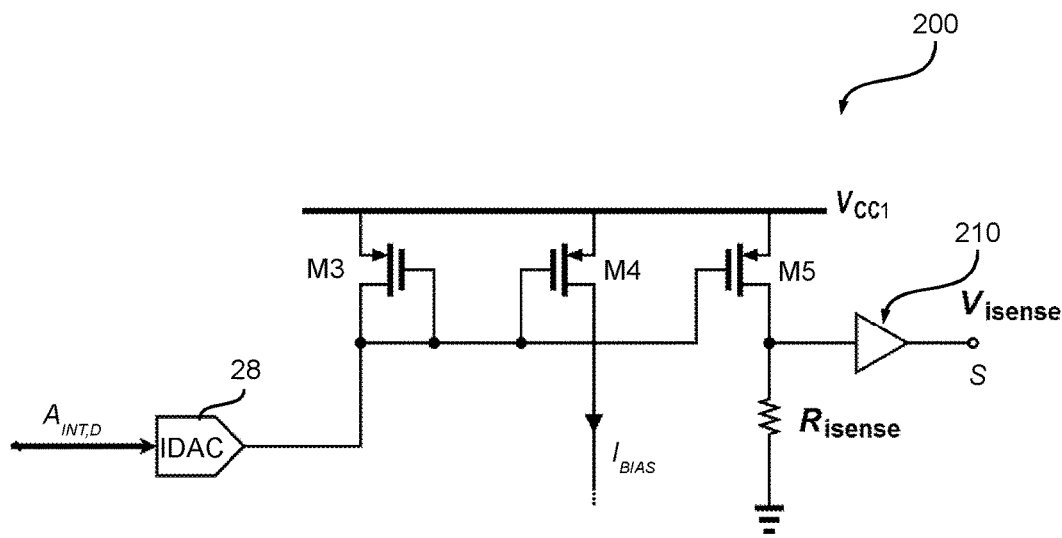
FIG. 16 shows an embodiment of a variable current source which may be used in the power amplifier of FIGS. 15 and 15a to 15f.

For example, FIG. 16 shows a possible embodiment of the current source 200.

Specifically, in the embodiment considered, the D/A converter 28 is a current digital-to-analog converter (IDAC), which generates a current as a function of the digital gain signal $A_{INT,D}$.

In the embodiment considered, the current generated by the IDAC 28 is fed to a current mirror including two transistors M3 and M4, e.g., FET (field-effect transistor), wherein the output of the current mirror provides the current $I_{BIAS}$.

For example, in the embodiment considered, two p-channel FET M3 and M4 are used. For example, in the embodiment considered, the sources of the transistors M3 and M4 are connected to a voltage supply $V_{CC1}$, whereas the drain of the transistor M3 is connected both to the IDAC 28 and the gates of the transistors M3 and M4. Accordingly, the drain of the transistor M4 provides a current $I_{BIAS}$, which is proportional to the current at the output of the IDAC 28.

In the embodiment being considered in FIG. 15, the current $I_{BIAS}$ generated by the current source 200 is fed to a current mirror including two transistors M1 and M2, e.g., bipolar junction transistors.

For example, in the embodiment considered, two npn bipolar transistors M1 and M2 are used. For example, in the embodiment being considered, the emitter of the transistors M1 and M2 are connected to ground, while the collector of the transistor M2 is connected both to the current source 200 and the bases of the transistors M1 and M2. Finally, the collector of the transistor M1 is connected to a node 206. Accordingly, the collector-emitter current I flowing through the transistor M1 will be proportional to the current $I_{BIAS}$.

Generally, instead of using two current-mirrors (M1/M2 and M3/M4), also only one current mirror could be used or the IDAC 28 could directly be used in place of the transistor M1.

In the embodiment considered, the current I is applied to a differential amplifier stage including, e.g., two bipolar junction transistors Q1 and Q2, such as npn transistors, configured to amplify the signal IN.

Specifically, in the embodiment considered, the emitter terminals of the transistors Q1 and Q2 are connected to the node 206 to which is applied the current I, i.e., emitter terminals of the transistors Q1 and Q2 are connected to the drain of the transistor M1. Conversely, the base terminal of the transistor Q1 is connected to the positive terminal of the signal IN and the base terminal of the transistor Q2 is connected to the negative terminal of the signal IN. Accordingly, the variable current source 200, the current mirror M1/M2 and the differential amplifier stage Q1/Q2 implement the differential amplifier with variable gain 24.

In the embodiment being considered, the output of the differential amplifier stage Q1/Q2 is provided via a switching stage 26 to an output stage 204.

For example, in the embodiment being considered, the output stage 204 is based on a transformer having a primary winding with a central tap connected to the supply voltage $V_{CC3}$ and wherein the secondary winding provides the output signal OUT. Accordingly, by changing the flow direction of the current I through the primary winding as a function of the signal IN, the alternating signal IN will be transferred to the output OUT, wherein the amplification depends on the value of the current I and the transformer ratio.

Generally, also other output stages 204 may be used. For example, reference can be made to FIG. 1 of document U.S. Pat. No. 7,312,660 B2, which is incorporated by reference herein in its entirety to the extent not inconsistent with the specific teachings and definitions of the present application. In fact, in general, the output stage 204 is configured to transfer a given current flow to the output of the power amplifier 20.

In the embodiment being considered, the switching stage 26 transfers thus selectively the current flow generated by the variable gain amplifier (200, M1/M2, Q1/Q2) to the output stage 204 as a function of the mute control signal $MUTE_{INT}$. Specifically, in the embodiment considered, the output of the variable gain amplifier is connected either to the output stage 204 or a dummy load, represented in the embodiment considered by a supply voltage $V_{CC2}$. For example, in case the mute control signal $MUTE_{INT}$ is greater than a given threshold, the output of the variable gain amplifier is connected to the output stage 204 and when the mute control signal $MUTE_{INT}$ is smaller than a given threshold, the output of the variable gain amplifier is connected to the supply voltage $V_{CC2}$.

For example, in the embodiment considered, the switching stage 26 is implemented with four bipolar junction transistors Q3, Q4, Q5 and Q6, such as npn transistors.

Specifically, the emitter terminals of the transistors Q3 and Q5 are connected (e.g., directly) to the collector terminal of the transistor Q1 and the emitter terminals of the transistors Q4 and Q6 are connected (e.g., directly) to the collector terminal of the transistor Q2. The collector terminal of the transistor Q3 is connected (e.g., directly) to a first terminal of the output stage and the collector terminal of the transistor Q4 is connected (e.g., directly) to the second terminal of the output stage. Conversely, the collector terminal of the transistors Q5 and Q6 are connected (e.g., directly) to the dummy load, e.g., $V_{CC2}$. Finally, the base terminals of the transistors Q3 and Q4 are connected to a first (e.g., negative) terminal of the signal $MUTE_{INT}$ and the base terminals of the transistors Q5 and Q6 are connected to the second (e.g., positive) terminal of the signal $MUTE_{INT}$.

Accordingly, in the embodiment being considered, the transistors Q3 and Q4 are used to connect the output of the variable gain amplifier to the output stage 204 and the transistors Q5 and Q6 are used to connect the output of the variable gain amplifier to the dummy load. Specifically, considering the connection of the signal $MUTE_{INT}$, the output of the power amplifier 20 is switched on when the signal $MUTE_{INT}$ is low.

For example, this is also shown schematically in the waveforms a)-f) in FIG. 15.

Specifically, FIG. 15f shows an exemplary waveform for the current $I_{BIAS}$ generated by the current source 200 as a function of the gain signal $A_{INT}$.

This (settable) current will also flow through the differential amplifier stage including the transistors Q1 and Q2 (see FIG. 15c).

Conversely, the mute signal $MUTE_{INT}$ (an exemplary waveform of the signal $MUTE_{INT}$ is shown in FIG. 15d) determines whether this current flows through the switches Q3/Q4 and thus the output stage 204 (an exemplary waveform of the current flowing through the switch Q3 is shown in FIG. 15a) or Q5/Q6 (an exemplary waveform of the current flowing through the switch Q5 is shown in FIG. 15b).

In the embodiment considered, the signal IN is an oscillating signal, and as schematically shown in FIG. 15e also the signal OUT will be an oscillating signal when the switches Q3 and Q4 are closed, because the current I flows alternatively through the switches Q1 or Q2.

Accordingly, in the embodiment being considered, the amplitude of the current I is not varied by the switching stage 26, but is only determined by the current generator 200 (and possibly the current mirror M1/M2).

In the embodiment shown in FIG. 15 (see in particular FIG. 15f), it is thus advantageous to set the gain $A_{INT}$ to the maximum value $A_{MAX}$ (used when the output of the power amplifier 20 is switched on) when the output of the power amplifier 20 is switched off.

In fact, by maintaining the current provided by the current source 200 as much as possible constant (except for the rising and falling ramps discussed in the foregoing), thermal variations during switch on/off phases are reduced and the temperature of the power amplifier 20 may remain almost constant, avoiding, e.g., thermal pulling phenomena on the VCO 12, e.g., in case the respective PLL is embedded in the chip including also the power amplifier 20.

Figure 17:
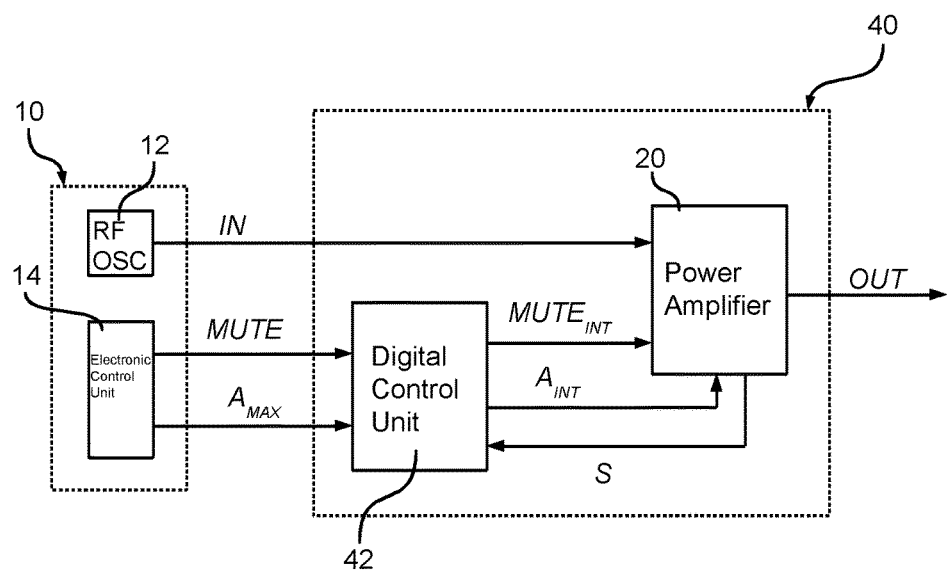
FIGS. 17, 18, 19a and 19b show still further embodiments of a power amplifier circuit in accordance with the present disclosure and signals generated during operation of these power amplifier circuits.

FIG. 17 shows a further embodiment, in which the control unit 42 is configured to vary the signal $A_{INT}$ during the switch-on and/or switch-off ramps as a function of a feedback signal S provided by the power amplifier 20.

For example, the feedback control signal S may be used to perform a closed loop control and thus may be used to replace the counters 4246 and/or 4250, which implement a predictive/open loop control. For example, the feedback signal S may be used to:

delay the rising/switch-on ramp until the output current is stable once the output of the power amplifier 20 has been switched on, and/or delay the switch-off of the output of the power amplifier 20 until the output current/power has reached a given minimum power level.

Figure 18:
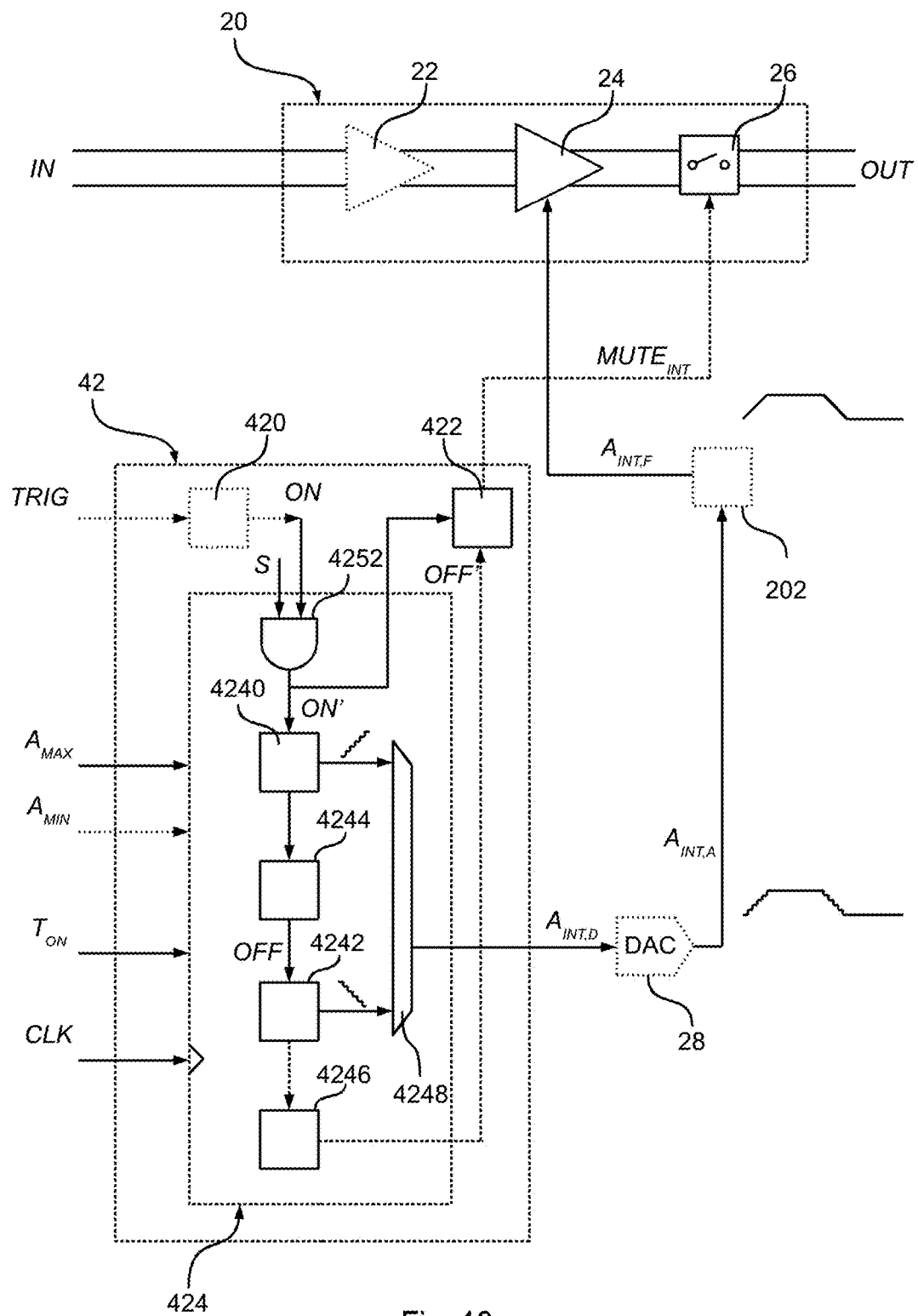

For example, FIG. 18 shows an embodiment wherein the signal S is used to delay the rising/switch-on ramp until the output current is stable once the output of the power amplifier 20 has been switched on.

Specifically, as shown in FIG. 18 this may be achieved by replacing the counter 4250 with a combinational logic 4252, such as an AND gate, which receives at input the signal ON generated by the block 420 and the signal S, and provides at output the delayed version ON' of the signal ON. A similar circuit may also be used to replace the counter 4246, i.e., a combinational logic may be used which receives at input the signal generated by the counter 4242 and the signal S, and provides at output the delayed switch-off signal OFF'.

For example, in the embodiment being considered, the signal S indicates whether the current $I_{BIAS}$ or similarly the current I is smaller than a given value.

Figure 19A:
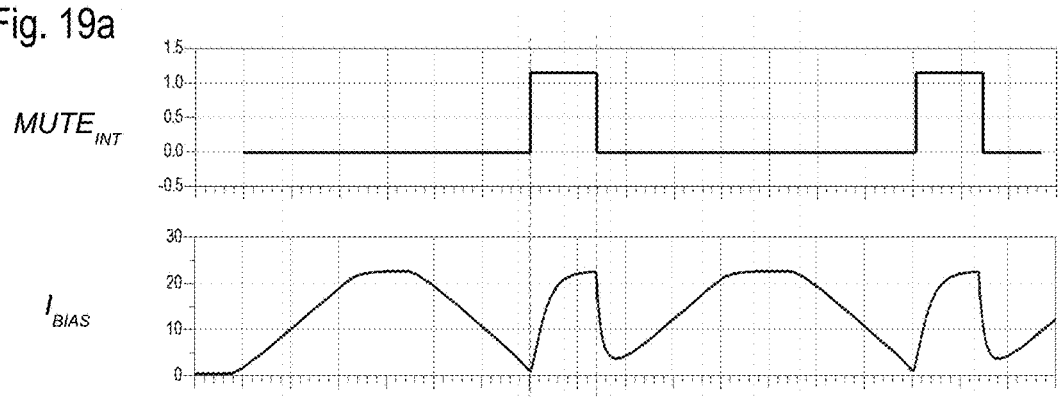

For example, as shown in FIG. 19a, this control is particularly useful for the power amplifier 20 disclosed with respect to FIG. 15. In fact, in this case, the gain $A_{INT}$ is set to the value $A_{MAX}$ when the output of the power amplifier 20 is deactivated via the mute signal $MUTE_{INT}$. Conversely, when the output has to be switched on, the gain $A_{INT}$ is set to the value $A_{MIN}$. However, the variation of the gain is not immediately transferred to the current $I_{BIAS}$. Accordingly, the output of the power amplifier 20 is not switched on with a minimum current.

Figure 19B:
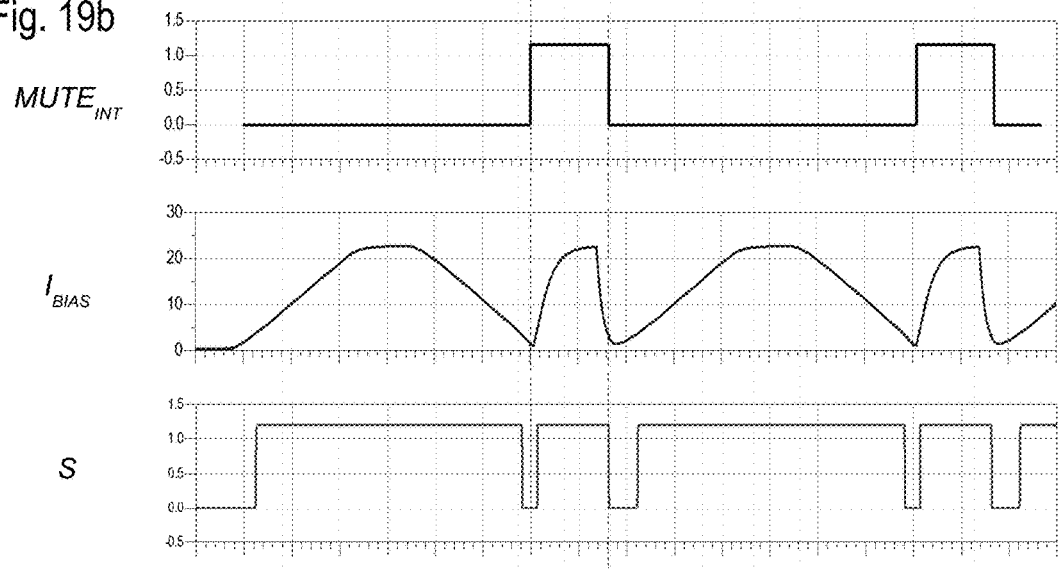

Conversely, as shown in FIG. 19b, in the embodiment considered, the signal S indicates whether the current $I_{BIAS}$ is smaller than a given threshold value. Accordingly, the switch on via the mute signal $MUTE_{INT}$ (e.g., generated by the switching block 422 in FIG. 18) and the generation of the rising ramp (e.g., via the counter block 4240 in FIG. 18) are delayed (e.g., by means of the generation of the delayed signal ON' at the gate 4252 in FIG. 18) until the signal S indicates that the current $I_{BIAS}$ is smaller than a given threshold value, i.e., the switch from $A_{MAX}$ to $A_{MIN}$ has been completed.

For example, as shown in FIG. 16, the current $I_{BIAS}$ and similarly I may be sensed by providing an additional current mirror branch. For example, in the embodiment being considered a further transistor M5, a p-channel FET in the embodiment being considered, is connected with its gate to the drain of the transistor M3, while the source of the transistor M5 is connected to the voltage supply $V_{CC1}$. Accordingly, the drain of the transistor M5 provides a current, which is proportional to the current $I_{BIAS}$. This current is sensed by a current sensor, e.g., a shunt resistor $R_{isense}$ generating a signal being indicative of the current $I_{BIAS}$.

For example, in the embodiment considered, a comparator 210, such as a Schmitt trigger, is used to generate a signal $V_{isense}$ (representing the feedback signal S) indicating whether the current $I_{BIAS}$ is greater than a first threshold or smaller than a second threshold (possibly being the same as the first threshold).

Of course, without prejudice to the principles of the present disclosure, the details of construction and embodiments of the present disclosure may vary widely with respect to what has been described and illustrated herein purely by way of example, without thereby departing from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of switching on and off a power amplifier, the power amplifier, comprising:
    generating a mute control signal indicating whether an output signal of the power amplifier should be switched on or switched off;
    generating a gain control signal having a value that determines a gain of the power amplifier;
    generating the output signal by amplifying an input signal as a function of said gain control signal to generate the output signal, the gain control signal being based on switch-on ramp data responsive to the mute control signal indicating the power amplifier should be switched on, and the switch-on ramp data increasing the gain control signal from a minimum gain value to a maximum gain value;
    generating the output signal by amplifying said input signal as a function of said gain control signal to generate the output signal based on switch-off ramp data responsive to the mute control signal indicating the power amplifier should be switched off, the switch-off ramp data decreasing the gain control signal from the maximum gain value to the minimum gain value; and
    switching off the output signal of the power amplifier when the gain control signal has the maximum gain value in response to the mute control signal indicating the output signal of the power amplifier should be switched off.

2. The method according to claim 1, wherein said at least one of said switch-on ramp or said switch-off ramp data comprise data identifying one or more ramp-steps and/or one or more ramp-widths, and wherein said gain control signal is generated by increasing or decreasing said gain control signal as a function of said one or more ramp-steps and/or one or more ramp-widths.

3. The method of claim 2, further comprising:
    controlling an up-counter to generate a series of up-count values to thereby generate the switch-on ramp data; and
    controlling a down-counter to generate a series of down-count values to thereby generate the switch-off ramp data.

4. The method of claim 3, wherein each of the switch-on ramp data and switch-off ramp data include at least one of variable ramp-steps or variable ramp-widths.

5. The method according to claim 1, generating the gain control signal comprises storing data in a memory for the switch-on and switch-off ramp data or generating the gain control signal based on a mathematical function.

6. The method according to claim 1, further comprising:
    receiving data identifying a switch-on duration; and
    determining whether said output signal of said power amplifier should be switched off by determining whether said switch-on duration has lapsed since said gain control signal has reached said maximum gain value.

7. The method of claim 1, further comprising providing a delay between the gain control signal and the mute control signal.

8. The method of claim 7, wherein providing the delay between the gain control signal and the mute control signal comprises controlling a counter to generate a count value that determines the delay.

9. The method of claim 7, wherein providing the delay between the gain control signal and the mute control signal comprises:
generating a variable bias current having a value that determines the gain of the power amplifier; and
generating a feedback control signal based on the variable bias current, the feedback signal setting a value of the delay.

10. The method according to claim 7, further comprising:
delaying said switching on of said output signal of said power amplifier and/or said generation of said gain control signal with respect to said mute control signal indicating that said signal output of said power amplifier should be switched on, and/or
delaying said switching off of said signal output of said power amplifier with respect to said decreasing of said gain control signal.

11. A power amplifier circuit, comprising:
a power amplifier including:
a signal input for receiving an input signal,
a signal output for providing an output signal,
a gain control input for receiving a gain control signal being indicative of a requested gain; and
a mute control input for receiving a mute control signal indicating whether said signal output should be switched on or switched off;
a control unit coupled to said power amplifier to provide the gain control signal and the mute control signal, the control unit being configured to generate the gain control signal having a switch-on ramp and a switch-off ramp based on switch-on and switch-off ramp data having a maximum gain value, the power amplifier being configured:
in response to said mute control signal indicating that the said signal output should be switched on, to generate at said signal output the output signal by amplifying said input signal as a function of said gain control signal;
in response to said mute control signal indicating that the said signal output should be switched off, to set said gain control signal to the maximum gain value and to deactivate said signal output; and
delay the mute control signal for a predetermined time relative to the gain control signal when the mute control indicates said signal output should be switch off.

12. The power amplifier circuit according to claim 11, wherein the control unit comprises a first circuit configured to receive a control signal indicating whether said signal output of said power amplifier should be switched on and configured to generate a switch-on signal indicating that said signal output of said power amplifier should be switched on as a function of said control signal.

13. The power amplifier circuit according to claim 12, wherein said control signal indicates whether said signal output of said power amplifier should be switched off, and wherein said first circuit is configured to generate a switch-off signal indicating that said signal output of said power amplifier should be switched off as a function of said control signal, and wherein said control unit is configured to generate said gain control signal as a function of said switch-off ramp data identifying said switch-off ramp when said switch-off signal indicates that said signal output of said power amplifier should be switched off.

14. The power amplifier circuit according to claim 13, wherein said control unit is configured to generate a further switch-off signal responsive to said gain control signal having reached a first gain value at the end of said switch-off ramp, said control unit including a second circuit configured to,
generate said mute control signal of said power amplifier in order to indicate that said signal output of said power amplifier should be switched on when said switch-on signal indicates that said signal output of said power amplifier should be switched on; and
generate said mute control signal of said power amplifier in order to indicate that said signal output of said power amplifier should be switched off when said further switch-off signal is generated.

15. The power amplifier circuit according to claim 14, wherein:
said generating said mute control signal of said power amplifier in order to indicate that said signal output of said power amplifier should be switched on when said switch-on signal indicates that said signal output of said power amplifier should be switched on comprises delaying said switch-on signal, and/or
said generating said mute control signal of said power amplifier in order to indicate that said signal output of said power amplifier should be switched off when said further switch-off signal is generated comprises delaying said further switch-off signal.

16. The power amplifier circuit according to claim 11, wherein said data identifying said switch-on ramp and/or said switch-off ramp comprise data identifying one or more ramp-steps and/or one or more ramp-widths, and wherein the control unit comprises a counter block comprising one or more counters for generating said gain control signal by increasing or decreasing said gain control signal as a function of said one or more ramp-steps and/or one or more ramp-widths.

17. A system, comprising:
a radio frequency signal generator; and
a power amplifier circuit coupled to the radio frequency signal generator, the power amplifier circuit including
a power amplifier including:
a signal input for receiving an input signal,
a signal output for providing an output signal,
a gain control input for receiving a gain control signal being indicative of a requested gain, and
a mute control input for receiving a mute control signal indicating whether said signal output should be switched on or switched off; and
a control unit coupled to said power amplifier to provide the gain control signal and the mute control signal, the control unit being configured to generate the gain control signal having a switch-on ramp and a switch-off ramp based on switch-on and switch-off ramp data having a maximum gain value, the power amplifier being configured to:
in response to said mute control signal indicating that the said signal output should be switched on, generate at said signal output the output signal a first predetermined delay time after the mute control signal indicates the signal output should be switched on by amplifying said input signal as a function of said gain control signal;
in response to said mute control signal indicating that the said signal output should be switched off, set said gain control signal to the maximum gain value and to deactivate said signal output; and
deactivate said signal output a second predetermined delay time after the mute control signal indicates the signal output should be switched off when the mute control signal indicates said signal output should be switched off.

18. The system of claim 17, wherein radio frequency signal generator comprises an RF oscillator.

19. The system of claim 17, wherein the control unit includes a first circuit that is further configured to:
   receive a control signal indicating whether said signal output of said power amplifier should be switched on; and
   generate a switch-on signal indicating that said signal output of said power amplifier should be switched on as a function of said control signal.

20. The system of claim 19, wherein said control signal indicates whether said signal output of said power amplifier should be switched off, and wherein said first circuit is configured to generate a switch-off signal indicating that said signal output of said power amplifier should be switched off as a function of said control signal, and wherein said control unit is configured to generate said gain control signal as a function of said switch-off ramp data identifying said switch-off ramp when said switch-off signal indicates that said signal output of said power amplifier should be switched off.

* * * * *